US010879921B2

(12) United States Patent
Pardoen et al.

(10) Patent No.: US 10,879,921 B2
(45) Date of Patent: Dec. 29, 2020

(54) INTEGRATED CIRCUIT AND METHOD FOR COMMUNICATING DATA

(71) Applicant: Melexis Technologies SA, Bevaix (CH)

(72) Inventors: Matthijs Pardoen, Neuchatel (CH); Cesare Ghezzi, Neuchatel (CH); Kevin Fahrni, Bienne (CH)

(73) Assignee: Melexis Technologies SA, Bevaix (CH)

( * ) Notice: Subject to any disclaimer, the term of this patent is extended or adjusted under 35 U.S.C. 154(b) by 0 days.

(21) Appl. No.: 16/668,563

(22) Filed: Oct. 30, 2019

(65) Prior Publication Data

US 2020/0145017 A1    May 7, 2020

(30) Foreign Application Priority Data

Nov. 2, 2018  (EP) .................................... 18204074

(51) Int. Cl.
*H03M 1/66* (2006.01)
*H03M 1/08* (2006.01)
*G05F 1/595* (2006.01)

(52) U.S. Cl.
CPC .......... *H03M 1/0845* (2013.01); *G05F 1/595* (2013.01); *H03M 1/0827* (2013.01)

(58) Field of Classification Search
CPC .. H03M 1/0845; H03M 1/0827; H03M 1/765; H03M 1/74; H03M 1/66; G05F 1/595; H03F 1/0211; H03F 3/45475; H04L 25/4902
See application file for complete search history.

(56) References Cited

U.S. PATENT DOCUMENTS

| 6,023,183 | A  | * | 2/2000 | Cao ................... H03K 19/01852 327/333 |
| 6,621,438 | B1 | * | 9/2003 | Hong .................. H03M 1/0665 341/144 |
| 8,400,849 | B1 |   | 3/2013 | Dornseifer et al. |
| 8,767,354 | B1 |   | 7/2014 | Ferris et al. |
| 10,014,873 | B1 | * | 7/2018 | van Veldhoven ..... H03M 1/066 |

(Continued)

FOREIGN PATENT DOCUMENTS

GB    2 373 654    *  9/2002

OTHER PUBLICATIONS

Koganezawa et al., "Development of Shear-Mode Piezoelectric Microactuator for Precise Head Positioning," Fujitsu Scientific & Technical Journal, vol. 37, No. 2, Dec. 2001, pp. 212-219.

(Continued)

*Primary Examiner* — Jean B Jeanglaude
(74) *Attorney, Agent, or Firm* — Workman Nydegger

(57) ABSTRACT

An integrated circuit is provided that includes an output stage circuit. The output stage circuit includes an input node for receiving a digital input signal, a supply voltage node for receiving a supply voltage signal, a digital to analog convertor for converting the digital signal, an amplifier for amplifying the converted signal, a first/second and optionally third voltage regulator generating a first/second and optionally third voltage signal, and a greatest-voltage selector circuit for providing power to the amplifier. Two different voltages are provided to the DAC. The output signal can be a SENT signal. The circuit is highly robust against power-interruptions and EMI.

15 Claims, 13 Drawing Sheets

(56) References Cited

U.S. PATENT DOCUMENTS

| | | | |
|---|---|---|---|
| 2005/0140446 A1* | 6/2005 | Mulder | H03H 11/32 |
| | | | 330/259 |
| 2008/0116979 A1* | 5/2008 | Lesso | H03G 1/0088 |
| | | | 330/297 |
| 2012/0155144 A1 | 6/2012 | Xia et al. | |
| 2013/0148240 A1 | 6/2013 | Ferris et al. | |
| 2014/0159767 A1* | 6/2014 | Lee | G01R 31/2601 |
| | | | 324/762.01 |
| 2017/0054448 A1* | 2/2017 | Lye | H03M 1/204 |
| 2018/0081332 A1* | 3/2018 | Mikamo | H03K 17/687 |

OTHER PUBLICATIONS

Pierco et al., "A 16 Channel High-Voltage Driver with 14 Bit Resolution for Driving Piezoelectric Actuators," IEEE Transactions on Circuits and Systems I: Regular Papers, vol. 62, No. 7, Jul. 2015, pp. 1726-1736.

European Search Report from EP Application No. EP18204074, dated Apr. 15, 2019.

* cited by examiner

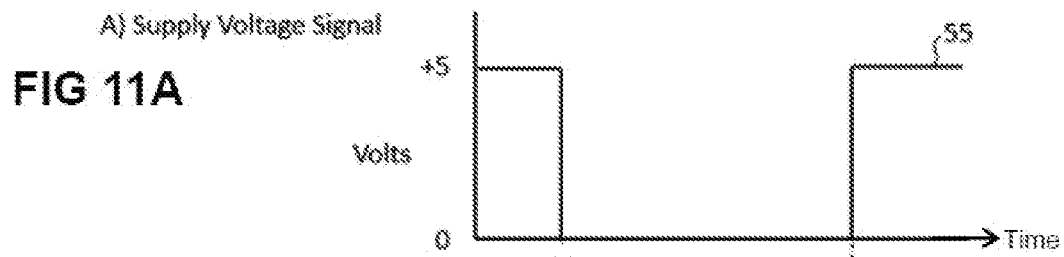
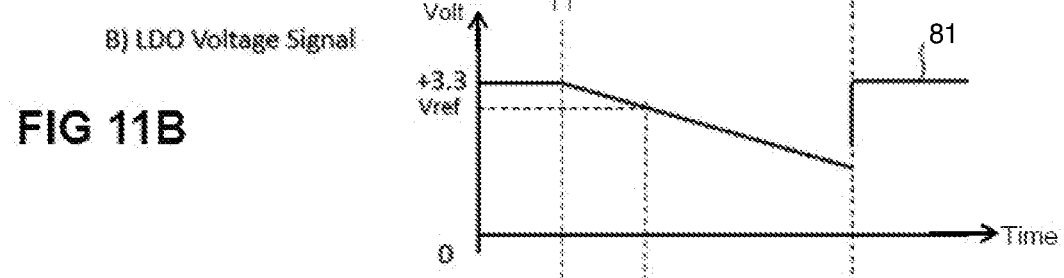
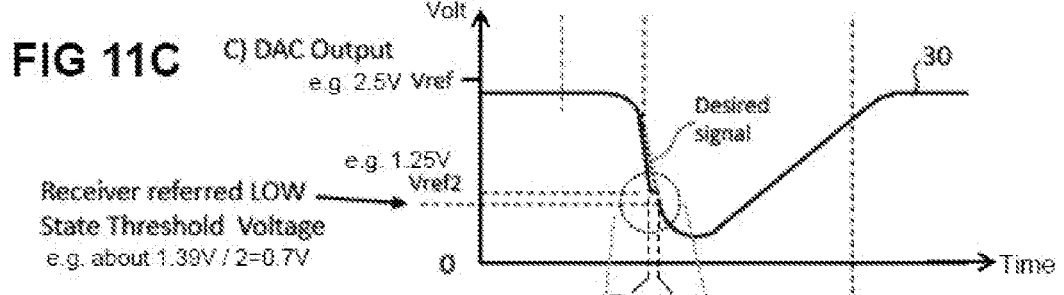
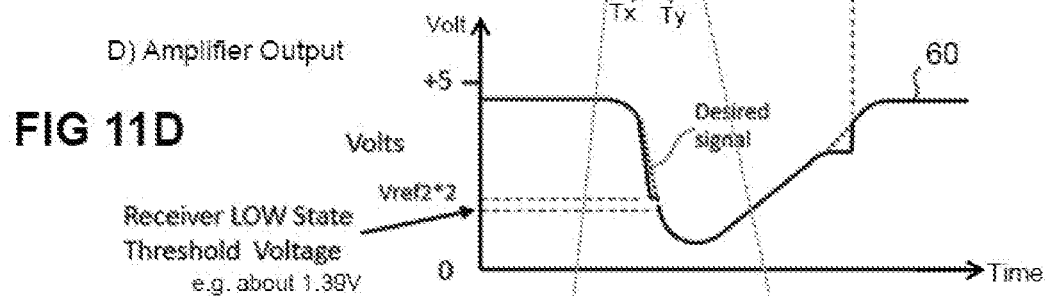
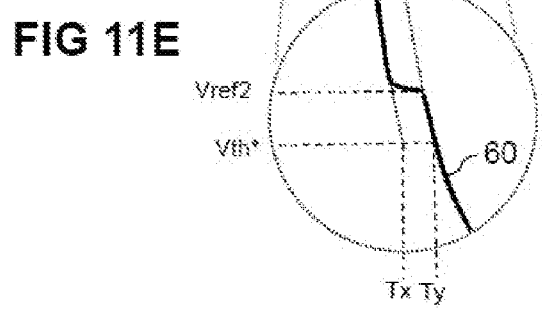

INTEGRATED CIRCUIT AND METHOD FOR COMMUNICATING DATA

FIELD

The present invention relates to electronic circuits and methods for generating analog communication signals according to a communication protocol. In particular, the present invention provides an integrated circuit with an output-stage circuit for converting digital signals and for amplifying the converted signals into analog signals in the presence of supply voltage interruptions.

BACKGROUND

Electronic systems can include spatially distributed and communicating components that interact through wires, wire bundles, or buses that convey electrical signals. The distributed components can be analog, digital, or some combination of analog and digital components. Likewise, the electrical signals communicated between the distributed components can be analog or digital or some combination of analog and digital.

In many electronic systems, some or all of the distributed components are standardized, have standardized functions, or communicate using a standard protocol and a standard electrical interface. For example, analog components can communicate over wires using analog signals that are most often voltage signals whose values correspond to the magnitude of a voltage or magnitude of a differential voltage within a specified voltage range. Digital components can communicate using pulse-width modulation methods to serially communicate encoded digital values. Other digital communication standard protocols are known, for example the Controller Area Network (CAN), the Local Interconnect Network (LIN), and the Single-Edge Nibble Transmission (SENT) protocol designed for communicating between a sensor device and a controller, for example an engine control unit (ECU) in automotive applications (Society of Automotive Engineers (SAE) standard J2716).

The SENT protocol is a point-to-point system for transmitting digital data with a low system cost. In the simplest specification, the SENT protocol is a one-way voltage interface using three wires, a signal (information) line, a supply voltage, and a ground line. No clock signal is provided. Data is transmitted in half-byte (four bits or "nibble") quantities. The interval between two falling edges of a modulated signal with an otherwise constant amplitude defines the value of the data. The SENT protocol includes cyclic redundancy checks (CRC) error checksum detection. A component sending signals using the SENT protocol must therefore reliably generate falling voltage edges on the signal line in order to specify the signal and encode the transmitted data. Correspondingly, a component receiving signals using the SENT protocol must reliably detect falling voltage edges on the signal line in order to evaluate the signal and decode the transmitted data.

Some distributed electronic systems must operate reliably and safely in difficult environments, such as automotive environments, that can experience extreme mechanical stress, electromagnetic interference (EMI), and environmental conditions, for example extreme acceleration, vibration, electrostatic discharge pulses, conducted radio frequency disturbances, and temperature and humidity. These environments can create undesirable electrical connections or electrical opens, noisy electrical signals, poor power or ground distribution at undesirable voltage levels, and improper operation. As a result, power supply voltage variations can be encountered in varying degrees for various components of a distributed electronic system and can lead to improper functioning of the components and the larger distributed system, often in unpredictable ways.

One approach to avoiding or preventing such supply-voltage variations in distributed systems is to provide local power storage at each distributed component (e.g. outside but adjacent each chip), for example with low-drop-out (LDO) regulators and local capacitors commonly used in sensor designs. These capacitors (outside the chip) typically comprise one relative large capacitor of for example 1 to 10 µF, and a plurality of smaller capacitors of 100 nF. However, modern electronic systems are highly integrated and frequently have a small footprint or volume and capacitors tend to be relatively large and bulky, hence a voltage regulator with such capacitors does not fit inside standard chip packages, and another solution needs to be found.

In some circuits and transmission protocols, components require an absolute difference in voltage to enable proper functionality, for example changes in voltage levels. If supply voltage variations occur at the same time as generated or detected voltage changes, a false change can be recorded and, consequently, signal errors generated.

There is a need, therefore, for improved circuit designs that operate reliably and robustly in the presence of mechanical stress, electromagnetic interference, and widely variable environmental conditions.

SUMMARY

It is an object of embodiments of the present invention to provide an integrated semiconductor device comprising an output stage circuit and a method for transmitting data, which is more tolerant to power failures and/or electromagnetic interference.

It is a particular object of embodiments of the present invention to provide an integrated semiconductor device capable of continuing a serial communication, even in the event of a supply-voltage interruption during a predefined period, for example having a duration from 1 or 2 or 5 µs to 10 or 20 or 30 or 40 or 50 µs.

It is an object of embodiments of the present invention to provide an integrated semiconductor device, and a method for transmitting data in accordance with the SENT-protocol, in a manner which is more tolerant to power failures and/or electromagnetic interference.

It is an object of embodiments of the present invention to provide an integrated semiconductor device comprising a sensor, and a method for transmitting sensor data in accordance with the SENT-protocol, in a manner which is more tolerant to power failures and/or electromagnetic interference.

It is an object of embodiments of the present invention to provide an integrated semiconductor device comprising a sensor, and a method for transmitting sensor data in accordance with the SENT-protocol, in a manner that reduces the number of CRC errors in case of supply voltage interruptions.

It is an object of embodiments of the present invention to provide such an integrated semiconductor device comprising a sensor, capable of continuing an ongoing communication, without causing a CRC error and without an internal reset, or with a reduced risk for causing a CRC error, even in case of a supply voltage interruption (e.g. if the supply voltage is absent for about 25 microseconds, or if the supply voltage drops from about 5V to about 2.5V during about 25 µs).

It is a particular object to provide a packaged integrated semiconductor device having a limited number of discrete capacitors embedded in the package, but not integrated on the semiconductor substrate, of about 100 to 200 nF, preferably at most two discrete capacitors, more preferably only one discrete capacitor.

These and other objectives can be achieved by a device and a method according to embodiments of the present invention.

According to a first aspect, the present invention provides an integrated circuit comprising: an output stage circuit for converting a digital input signal into an analog output signal, the output stage circuit comprising: a digital input node for receiving the digital input signal; a supply voltage node for receiving a supply voltage signal having a nominal supply voltage level (e.g. about 5V); a digital to analog convertor responsive to the digital input signal and adapted to produce a converted signal; an amplifier configured for receiving and amplifying the converted signal, thereby generating the analog output signal; wherein the integrated circuit further comprises a first voltage regulator adapted for generating a first voltage signal having a nominal first voltage level (e.g. about 3.3V) lower than the nominal supply voltage level (e.g. about 5V), and for storing energy on a first capacitor at the nominal first voltage level (e.g. about 3.3V); and the integrated circuit further comprises a second voltage regulator, adapted for generating a second voltage signal having a nominal second voltage level (e.g. about 1.25V in FIG. 4; e.g. about 1.65V in FIG. 5) lower than the nominal first voltage level (e.g. about 3.3V); and the digital to analog convertor is configured for producing the converted signal based on a plurality of at least two voltage signals derived from the supply voltage, including at least the second voltage signal; and the output stage circuit further comprises a greatest-voltage selector circuit adapted for selecting a signal having a largest voltage level amongst a plurality of at least two signals including the supply voltage signal and the first voltage signal, and for providing the selected signal as a power signal to the amplifier.

The first voltage regulator may be configured for receiving the supply voltage signal or a signal derived therefrom.

The second voltage regulator may be configured for receiving the first voltage signal or the supply voltage.

It is an advantage of this circuit that the DAC is provided with two different voltages, one being smaller than the other, because this allows to generate the "converted signal" with an accurate (e.g. the intended) voltage level during a critical portion of the falling edge, even in case of a power dip or an EMI-event, e.g. when the lower of these voltage levels is still above its nominal value.

It is an advantage of this circuit that the amplifier is provided with the largest of at least two different voltages (the supply voltage signal and a first voltage signal), one being larger than the other (e.g. about 5.0V and 3.3V) because this allows to correctly amplify the converted signal to an accurate (e.g. the intended) voltage level during a critical portion of the falling edge, even in case of said power dip or EMI-event, in particular, even when the supply voltage signal is lower than its nominal value (e.g. 5V), but the first voltage signal is still at its nominal value (3.3V), and even further, when the first voltage signal is lower than its nominal value (e.g. 3.3V) but higher than e.g. twice the converted signal level.

It is an advantage that the combination of this "special DAC" and the "amplifier circuit being powered by the greatest voltage selector" yields an output signal with a correct voltage level during a critical portion of the falling edge, even in case of a power dip or an EMI-event, and without requiring a relatively large external capacitor (e.g. having a capacitance of at least 1 µF).

This circuit is ideal for communicating a signal according to the SENT protocol, where data is encoded based on the duration of time intervals between falling edges of the signal. It was found that this circuit is capable in many instances, to correctly continue sending data, even in case of a power dip.

In an embodiment, the integrated circuit comprises a semiconductor substrate embedded in a molded package, the molded package further comprising at least one discrete capacitor having a capacitance in the range from 100 to 200 nF, forming the (first) capacitor of the first voltage regulator configured for storing the first voltage signal (e.g. about 3.3V).

In an embodiment (see example in FIG. 5), the digital-to-analog convertor is configured for producing the converted signal based on the first voltage signal (e.g. about 3.3V) and based on the second voltage signal (e.g. about 1.65V).

In an embodiment, the nominal supply voltage level is a value in the range from 4.5V to 5.5V; and the nominal first voltage level is a value in the range from 3.0V to 3.6V; and the nominal second voltage level is a value in the range from 1.25V to 2.0V.

In an embodiment (see example in FIG. 5), the digital-to-analog convertor is configured for producing the converted signal based on the first voltage signal and based on the second voltage signal.

In an embodiment, the integrated circuit further comprises a third voltage regulator, configured for receiving the first voltage signal or the supply voltage signal; and adapted for generating a third voltage signal having a nominal third voltage level (e.g. about 2.5V) between the nominal first voltage level (e.g. about 3.3V) and the nominal second voltage level (e.g. about 1.25V).

In an embodiment, the nominal supply voltage level is a value in the range from 4.5V to 5.5V; and the nominal first voltage level is a value in the range from 3.0V to 3.6V; and the nominal second voltage level is a value in the range from 1.0V to 2.0V; and the nominal third voltage level is a value in the range from 2.2V to 2.8V.

In an embodiment (see example in FIG. 4), the digital-to-analog convertor is configured for producing the converted signal based on the second voltage signal (e.g. about 2.5V) and based on the third voltage signal (e.g. about 1.25V).

In an embodiment, the integrated circuit is configured to be used in an automotive environment.

In an embodiment, the greatest-voltage selector circuit is adapted for selecting a signal having a largest voltage level amongst a plurality of at least three signals including the supply voltage signal, the first voltage signal, and a voltage signal obtained from a node connected to an output of the amplifier.

Optionally, the integrated circuit further comprises a fourth capacitor, and the amplifier is configured for storing the analog output signal on the fourth capacitor.

During normal use, the output of the amplifier is connected to an electrical wire having a load capacitance.

It is a major advantage of being able to use some of the energy stored on the fourth capacitor and/or the load capacitor to temporarily power the amplifier, especially when the power dip or EMI event occurs substantially at the same moment as the falling edge of the output signal should be generated.

This embodiment is based on the insight that, just before the falling edge of the (envisioned) output signal, the voltage stored on the fourth and/or load capacitor is maximal (e.g. about 5V). This further increases the chance that a CRC-error can be avoided in the event of a power-dip or EMI-event.

Using a signal obtained from the output of the amplifier to power the amplifier is not trivial, because (i) it is against the law of physics that an amplifier can be powered by its own output, and (ii) because the voltage level at this output is not constantly high. And it is true that this trick or this "feature" would not work for a rising edge, but that is not what this "return signal" is intended for. The return signal is only intended to amplify a relatively small DAC output signal for a very small duration (e.g. about 1 to 5 microseconds), during the falling edge of the signal, while the capacitor(s) at the output of the amplifier is/are being discharged. It is noted that this trick would not work for a rising edge because that would require the output capacitor being charged, which is indeed against the law of physics, because energy cannot be created from nothing.

In an embodiment, the digital-to-analog converter comprises two or more series-connected resistors defining three or more nodes; and one of said at least two voltage signals derived from the supply voltage is connected to one of said nodes, and another of said at least two voltage signals derived from the supply voltage is connected to another of said nodes.

It is an advantage of such a DAC-structure that it generates a plurality of voltage levels, one of which can be selected. This is easy to build in an integrated circuit.

While in classical implementations, only one node is provided with power, in this implementation two different nodes are provided with power. This is especially advantageous in case of a power-dip or EMI-event, when the second voltage level is below its nominal value, but the first voltage level is still at its nominal voltage level, because it allows the smaller signal levels to be more accurately generated.

When this circuit is used for transmitting a data signal according to the SENT protocol, this DAC-structure allows to reduce CRC errors in case of a power-dip or EMI event, by being able (or having a higher chance of being able) to generate a signal that crosses the receiver threshold level at the correct moment in time.

In an embodiment, the digital to analog converter comprises an even number of series connected resistors.

In an embodiment, the digital to analog converter comprises an odd number of series connected resistors.

In an embodiment, the DAC has a resolution of exactly 3 bits, or exactly 4 bits, or exactly 5 bits, or exactly 6 bits. It was found that there is no need to use high resolution DACs to comply with Low frequency emission EMC requirements.

In an embodiment, the digital-to-analog converter is a unary coded DAC and each series-connected resistor has a substantially equal value.

In an embodiment, the digital-to-analog converter is a binary-weighted DAC and each series-connected resistor has a value substantially one half or twice the value of a series-connected resistor to which it is directly connected.

In an embodiment, the supply voltage signal is a voltage in the range from 4.5 to 5.5 Volt, or in the range from 4.75 to 5.25 Volt; and the integrated circuit further comprises a controller adapted for providing the digital input signal as a bitstream having a format such that the analog output signal derived therefrom is a single-edge nibble transmission protocol signal.

SENT (Single Edge Nibble Transmission) is a SAE Standard—SAE J2716—which describes a data protocol. It is used to transmit signal values between sensor and controller in the automotive industry. In this protocol, timing of the falling edges is of prime importance.

In an embodiment, the integrated circuit further comprises a sensor circuit connected to said controller; and the controller is further adapted for obtaining a sensor signal from the sensor circuit, and for providing the digital signal as a function of the sensor signal.

In an embodiment, the first voltage regulator is configured for generating the first voltage signal having the first nominal voltage in the range from about 3.0 to about 3.6 Volt; and the second voltage regulator is configured for generating the second voltage signal having the second nominal voltage in the range from about 1.10 to about 1.40 Volt; and optionally the third voltage regulator, if present, is configured for generating the third voltage signal having the third nominal voltage in the range from about 2.2 to about 2.8 Volt.

It is a major advantage that the second nominal voltage value is somewhat larger than the receiver threshold voltage (scaled by the amplifier factor), because this level works as a kind temporary "safety-net" in case the second voltage drops. It typically causes a kink or bend or nod in the curve, which effectively postpones the moment of crossing the threshold level of a SENT compliant receiver, thus effectively "saving the timing of passing the threshold level, thereby avoiding a wrong timing.

In an embodiment, the DAC is configured for generating the converted signal having a voltage in the range from about 0.0 V to about 2.5V and the amplifier is configured for amplifying the converted signal by a factor of about 2.0.

In an embodiment, the DAC is configured for generating the converted signal having a voltage in the range from about 0.0 V to about 3.3V and the amplifier is configured for amplifying the converted signal by a factor of about 1.5.

The integrated circuit is preferably implemented on a semiconductor substrate.

In an embodiment, the first capacitor (of the first voltage regulator) is a discrete capacitor, not integrated in the semiconductor substrate.

According to a second aspect, the present invention also provides a semiconductor device comprising: an integrated circuit according to the first aspect; and said first capacitor in the form of a discrete capacitor located outside the integrated circuit, but functionally connected to the integrated circuit.

Preferably the integrated circuit and this first capacitor are embedded in the chip package. The chip package may further comprise a lead frame.

In an embodiment, the integrated circuit is implemented in a single ended dual chip package, sometimes also referred to as Dual Mold Packages (DMPs).

It is a particular challenge to implement the semiconductor device in such a package, because these packages are not suited to incorporate large components, such as certain ceramic capacitors.

According to a third aspect, the present invention also provides a method of converting a digital input signal into an analog output signal in an output stage circuit of an integrated circuit, the method comprising: receiving a supply voltage signal from a supply voltage node, the supply voltage having a nominal supply voltage level (e.g. about 5.0 V); receiving said digital input signal from a digital input node; generating by a first voltage regulator a first voltage signal derived from the supply voltage signal, and storing energy on a first capacitance, the first voltage signal having a nominal first voltage level (e.g. about 3.3V) lower than the nominal supply voltage level (e.g. about 5V); generating by a second voltage regulator a second voltage signal derived from the first voltage signal or from the supply voltage signal, the second voltage signal having a nominal second voltage level (e.g. about 1.25V or about 1.65V) lower than the nominal first voltage level (e.g. about 3.3V); producing a converted signal derived from said digital input signal, by a digital-to-analog convertor based on at least two voltage signals derived from the supply voltage signal; amplifying the converted signal by an amplifier, thereby generating the output signal; selecting by a largest voltage selector circuit, a signal having a largest voltage level amongst a plurality of at least two signals including the supply voltage signal and the first voltage signal, and applying the selected signal as a power signal to the amplifier.

In an embodiment, the method further comprises the step of: generating, by a third voltage regulator, a third voltage signal having a nominal third voltage level (e.g. about 2.5V) between the nominal first voltage level (e.g. about 3.3V) and the nominal second voltage level (e.g. about 1.25V).

In an embodiment, the digital-to-analog converter comprises two or more series-connected resistors defining three or more nodes and the method further comprises: providing the second voltage signal to one of said nodes.

The method may further comprise: providing the first voltage signal to another one of said nodes. This is especially useful in case the integrated circuit does not have the above described third internal voltage generator.

The method may further comprise: providing the third voltage signal to another one of said nodes. This is especially useful in case the integrated circuit does have the above described third internal voltage generator.

In an embodiment, the method further comprises: obtaining a return signal from an output node connected to the output of the amplifier; and the step of selecting a largest voltage comprises: selecting a signal having a largest voltage level amongst a plurality of at least three signals including the supply voltage signal and the first voltage signal and the return signal, and providing the selected signal as a power signal to the amplifier.

In an embodiment, the method further comprises: storing energy on a fourth capacitor connected to the output node, and/or storing energy on a load capacitor connected to the output node. The load capacitor may be the capacitance formed by an electrical wire connected to the output node.

In an embodiment, the integrated circuit further comprises a sensor and a controller; and the method further comprises the steps of: obtaining sensor information from the sensor, by the controller; and providing the digital input signal as a bitstream containing the sensor information or data derived therefrom, and having a format such that the analog output signal derived therefrom is a single-edge nibble transmission (SENT) protocol signal.

In an embodiment, the method is applied in an automotive environment.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 11A to 11E show exemplary graphs illustrating the performance of a circuit according to illustrative embodiments of the present invention, in the presence of a supply voltage interruption.

Figure 1:
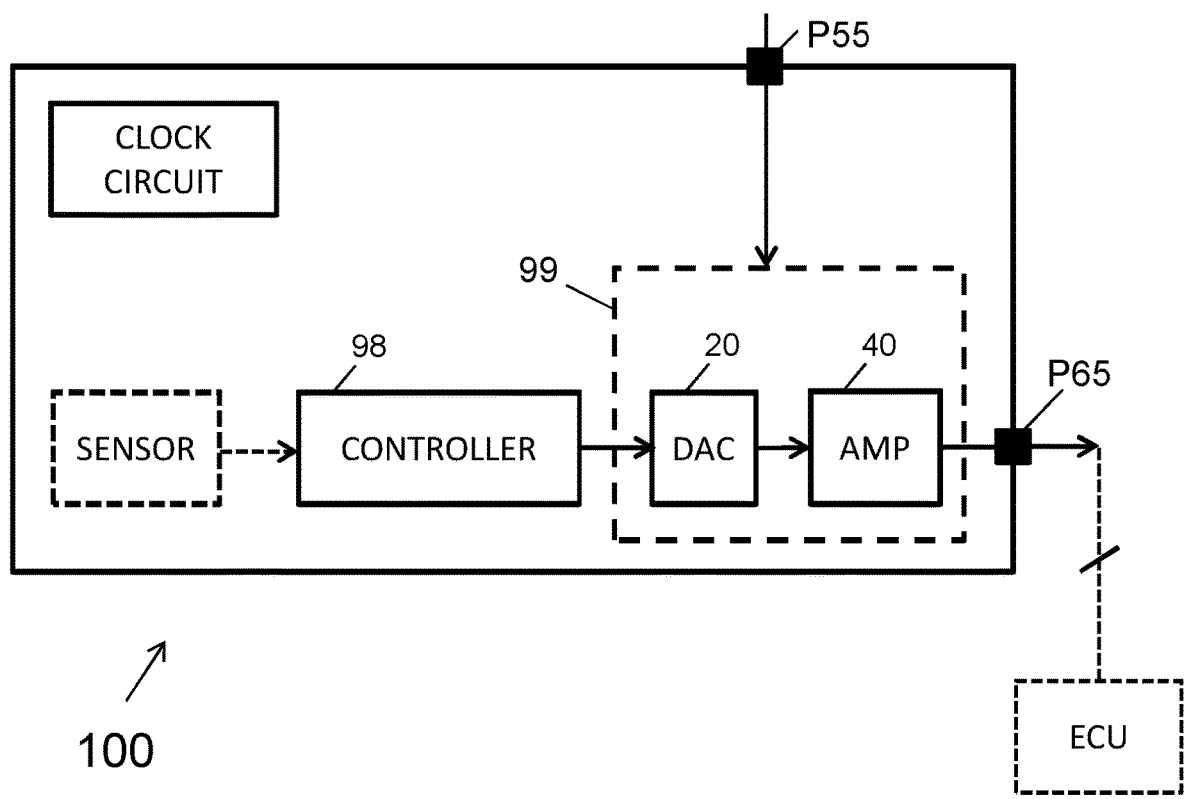
FIG. 1 is a high-level block-diagram of an integrated semiconductor device according to an embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures may not be drawn to scale.

DETAILED DESCRIPTION

Embodiments of the present invention provide an integrated circuit comprising electronic circuits for converting received digital control or data signals to generated amplified analog signals transmitted with an edge-dependent voltage interface or protocol. In particular, the present invention provides an integrated circuit comprising an output-stage circuit for accurately converting digital input signals and amplifying the converted signals in the presence of supply voltage interruptions to produce an analog output signal.

In particular, embodiments of the present invention are useful as integrated circuits comprising for example sensor or control circuits, that provide or transmit signals encoded with edge-dependent voltage interfaces, such as a single-edge nibble transmission (SENT) protocol signal, to transmit data from a sensor, such as a magnetic sensor, to a controller, such as an engine control unit (ECU). Embodiments of the present invention continue to operate effectively in the presence of micro-interruptions or variability in the supply voltage of the circuit.

According to embodiments of the present invention, a source device (such as a sensor device) transmits information to a receiving device (such as an engine control unit) using an edge-dependent voltage interface standard. The source device and receiving device are electronic devices electrically connected to a power supply and ground enabling the devices to operate. The information (e.g., data value) is communicated as an analog voltage on a single wire and is specified by the time between successive changes of the voltage on the single wire from a voltage greater than or equal to a HIGH state voltage to a voltage less than or equal to a LOW state voltage, for example as specified by the SAE J2716 standard.

In some embodiments of the present invention, the information signal is generated by a digital device that supplies temporally successive digital values to specify the voltage of the analog information signal over time, including any voltage state changes. The successive digital values must be converted to a time-varying analog output signal by an output-stage circuit, such as the output-stage circuit described herein. However, any one or all of the source device, receiving device, and wire are subject to environmental stress that results in supply voltage variability or interruption that can interfere with the correct generation of the analog information signal. Therefore, an output-stage circuit design that continues to provide a correct output information signal in the presence of supply voltage variability or interruption will be more robust in operation and provide better performance (e.g. in terms of less CRC errors, larger effective data throughput, etc).

FIG. 1 is a high-level block-diagram of an integrated semiconductor device 100.

The sensor circuit may comprise for example one or more magnetic sensors, one or more temperature sensors, one or more pressure sensors, one or more current sensors, one or more torque sensors, one or more optical sensors, one or more infrared sensors, and any combination hereof.

The integrated semiconductor device 100 has a power supply input port P55, for example for receiving a 5V voltage signal, and has an output port P65 for providing a communication signal containing information, for example sensor information.

The conductor circuit may further comprise a controller 98, e.g. a programmable microcontroller and/or a digital state machine, or combinations hereof. The controller 98 may comprise or be connected to an internal or external memory, for example volatile memory (e.g. RAM) and/or non-volatile memory (e.g. EPROM, FLASH), not shown. The controller 98 may be configured for obtaining information from the sensor, and for packaging the information according to a predefined format or structure or protocol. The controller may for example be configured for incorporating the sensor data into a serial bitstream, and for transmitting the bitstream to an external device, e.g. to an external processor (e.g. an ECU) via an output stage circuit 99 and via an output port P65.

The output port P65 may be connected to an input port of the external device, e.g. an external processor (e.g. ECU) via a serial bus, e.g. a multi-wire bus, e.g. a three-wire bus. In preferred embodiments, the bus carries a signal according to the SENT protocol.

Of course, the integrated semiconductor device 100 may comprise additional circuitry, such as for example biasing circuitry for biasing the one or more sensor(s), readout circuitry for obtaining data from the one or more sensors, timing circuitry, (e.g. an oscillator circuitry, clock dividers, etc.), non-volatile memory, etc., which are known per se in the art, but are not the main focus of the present invention, and are therefore not described in more detail herein.

Sensor circuits in automotive applications, which are connected to an Electronic Control Unit (ECU) need to be designed to have certain robustness when the system is aggressed by Electro Static Discharge (ESD) pulses, conducted radio frequency (RF)-disturbances or environmental stress affecting the supply voltage stability.

According to an aspect of the present invention, the output circuit 99 is especially adapted for transmitting information, e.g. sensor information in a manner which is highly robust against power failures and/or electro-magnetic interferences (EMI).

More specifically, in order to quantify the robustness of systems, standards describing test set-ups and measurements have been developed. Examples are the ISO-16750-2 [3] defining a significant number of supply voltage variation set-ups and the IEC 62132-4 [4], defining direct power injection (DPI) set ups applied to signal and supply pins. There are different levels of robustness identified using so called functional status classification (ISO-16750-1 [5]):

The system continues to operate normally, even during the aggression event;

The system continues to operate normally albeit that some performance parameters go beyond specified tolerances during the aggression;

The circuit recovers by itself after an aggression;

The circuit needs an external manipulation in order to recover from an aggression;

The circuit is destroyed after applying an aggression event.

It is an object of this invention to improve the functional status classification of sensor interfaces using the SENT communication protocol.

It is a particular aim of the present invention to provide an integrated sensor device, and a method of communicating, having at least functional status B, and preferably functional status A.

To this end, the output stage circuit 99 comprises a first voltage regulator 70 (see e.g. FIG. 2 to FIG. 5), adapted for generating a first voltage signal 81 having a nominal first voltage level (e.g. about 3.3V), lower than the nominal supply voltage level (e.g. about 5V), and for storing energy on a first capacitor C70 (see e.g. FIG. 2 to FIG. 5) at the nominal first voltage level. Thus, in contrast to some prior art documents where the supply voltage is boosted (i.e. has a voltage higher than the supply voltage), that is not the case in the present invention.

The output stage circuit 99 further comprises a second voltage regulator 72, adapted for generating a second voltage signal 82 having a nominal second voltage level lower than the nominal first voltage level. The nominal second voltage level may e.g. be equal to about 1.25V (see FIG. 4), or equal to about 1.65V (see FIG. 5), but other values in the range from about 1.25V to about 2.0V will also work, for example a voltage equal to about 1.8V.

The DAC 20 is configured for producing the converted signal 30 based on a plurality of at least two voltage signals derived from the supply voltage, including said second voltage signal 82. For example, in FIG. 5, the DAC is configured for generating the converted signal 30 based on the first voltage signal 81 and the second voltage signal 82. As another example, in FIG. 3 and FIG. 4, the DAC is configured for generating the converted signal 30 based on the second voltage signal 82, and a third voltage 83, the latter having a nominal third voltage level (e.g. 2.5V) between the nominal first voltage level (e.g. 3.3V) and the nominal second voltage level (e.g. 1.25V).

The output stage circuit 99 further comprises a greatest-voltage selector circuit 90 adapted for selecting a signal having a largest voltage level amongst a plurality of at least two signals including the supply voltage signal 55 (e.g.

about 5V) and the first voltage signal 81 (e.g. about 3.3V), and for providing the selected signal as a power signal 50 to the amplifier 40.

Preferably the inventors had to provide a solution in the form of a semiconductor device having a plurality of pins, but not requiring any discrete capacitors external to the semiconductor device. Thus, classical solutions, where at least one large capacitor (e.g. of at least 1 µF) is added to an internal voltage regulator to store energy to overcome a power-dip, were not an option.

After doing many experiments, the inventors came to the insight that a so called "worst case" scenario is when a power dip occurs more or less at the same moment as the device has to transmit a falling edge. And the inventors came to a further insight, best illustrated in FIGS. 11A to 11E, namely that, in case of a power-dip, the waveform of the output signal is allowed to be (initially) distorted, except around the threshold voltage level at which the external receiver (e.g. ECU) will detect a "falling edge" of the signal 60. This is especially important for protocols where the data is encoded by means of the timing of the falling edge, as is the case for the SENT protocol.

As illustrated in FIG. 11(*e*), the inventors came to the insight that a CRC error would be prevented if the signal generated by the cascade of the DAC and the Amplifier would pass the threshold voltage at the right moment, even if the signal would be partially distorted above or below this threshold voltage.

Based on these insights, they came to the idea of trying to prevent that—in the event of a power dip—the output signal would drop below the threshold-voltage of the receiver, which would trigger the receiver at the incorrect moment and eventually lead to a CRC error. They came to realize that this requires that both the DAC and the amplifier need to function correctly during this critical moment. And they came to the idea of using the combination of (i) a "special DAC" having (at least) two different voltage inputs, and (ii) to provide power to the amplifier using a greatest-voltage selector circuit.

Figure 5:
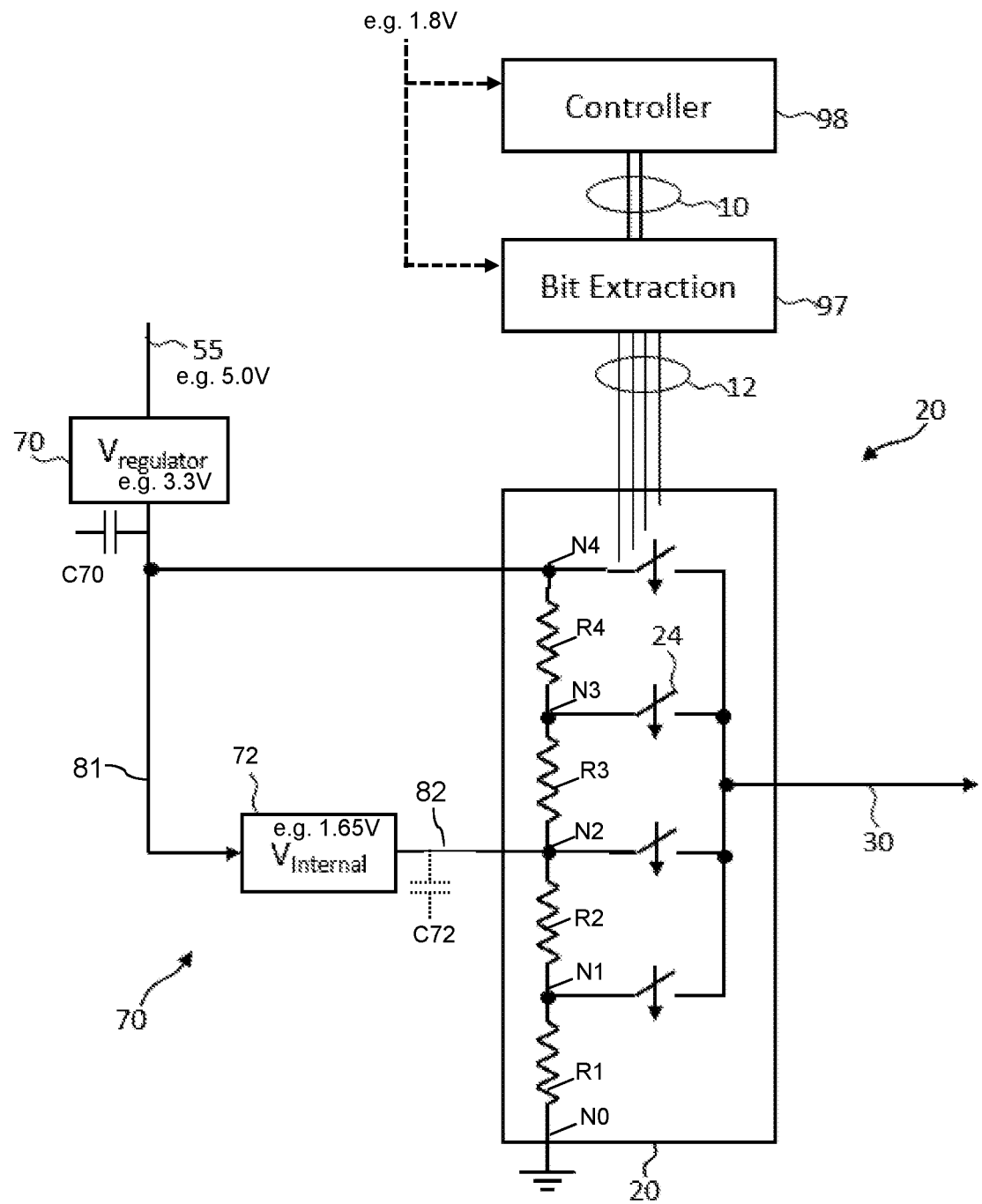

It is an advantage of this circuit that (i) the DAC is provided with two different voltages, one being smaller than the other, because this allows to generate the "converted signal" 30 with an accurate (e.g. the intended) voltage level during a critical portion of the falling edge, even in case of a power dip or an EMI-event, e.g. when the lower of these voltage levels is still above its nominal value (e.g. in the example of FIG. 5, when the signal 82 has a momentary voltage higher than 1.65 V, even if the first voltage signal is momentarily lower than its nominal voltage level, e.g. has dropped to a voltage level lower than 3.3V but higher than 1.9V or higher than 2.0V).

It is an advantage of this circuit that (ii) the amplifier is provided with the largest of at least two different voltages (e.g. the supply voltage signal and the first voltage signal), one being larger than the other (e.g. nominally about 5.0V and 3.3V) because this allows to correctly amplify the output of the DAC during a critical portion of the falling edge, even in case of said power dip or EMI-event, in particular, even when the supply voltage signal is lower than its nominal value (e.g. 5V), but the first voltage signal is still at its nominal value (3.3V), and even somewhat further, e.g. even when the first voltage signal is lower than its nominal value (e.g. 3.3V) but higher than e.g. twice the signal level of the converted signal 30, and/or is higher than 1.8V for example, which is the typical voltage used by the digital part of the chip, e.g. the controller 98.

It is an advantage that the combination of this "special DAC" and the "amplifier circuit being powered by the greatest voltage selector" yields an output signal 60 with a correct voltage level during a critical portion of the falling edge, even if the signal is distorted above and/or below the threshold region during a predetermined time period, e.g. as specified in the relevant standards.

It was found that this circuit is capable in many instances, to correctly continue sending data, even in case of a power dip. Such a circuit is ideal for communicating a signal where the integrity of falling edges needs to be preserved in case of a power-interruption, as is the case for example for the SENT protocol, where data is encoded based on the duration of time intervals between falling edges of the signal.

Of course, the highest voltage selector circuit needs to be very fast, e.g. having a reaction time significantly smaller than the microcut time. Considering the fact that the micro cut time is in the order of about 1 to 25 µs, a reaction time in the order of about 100 ns is sufficiently fast.

These are the main underlying ideas of the present invention. The rest of the document will describe exemplary embodiments of the output circuit 99 in more detail.

Figure 2:
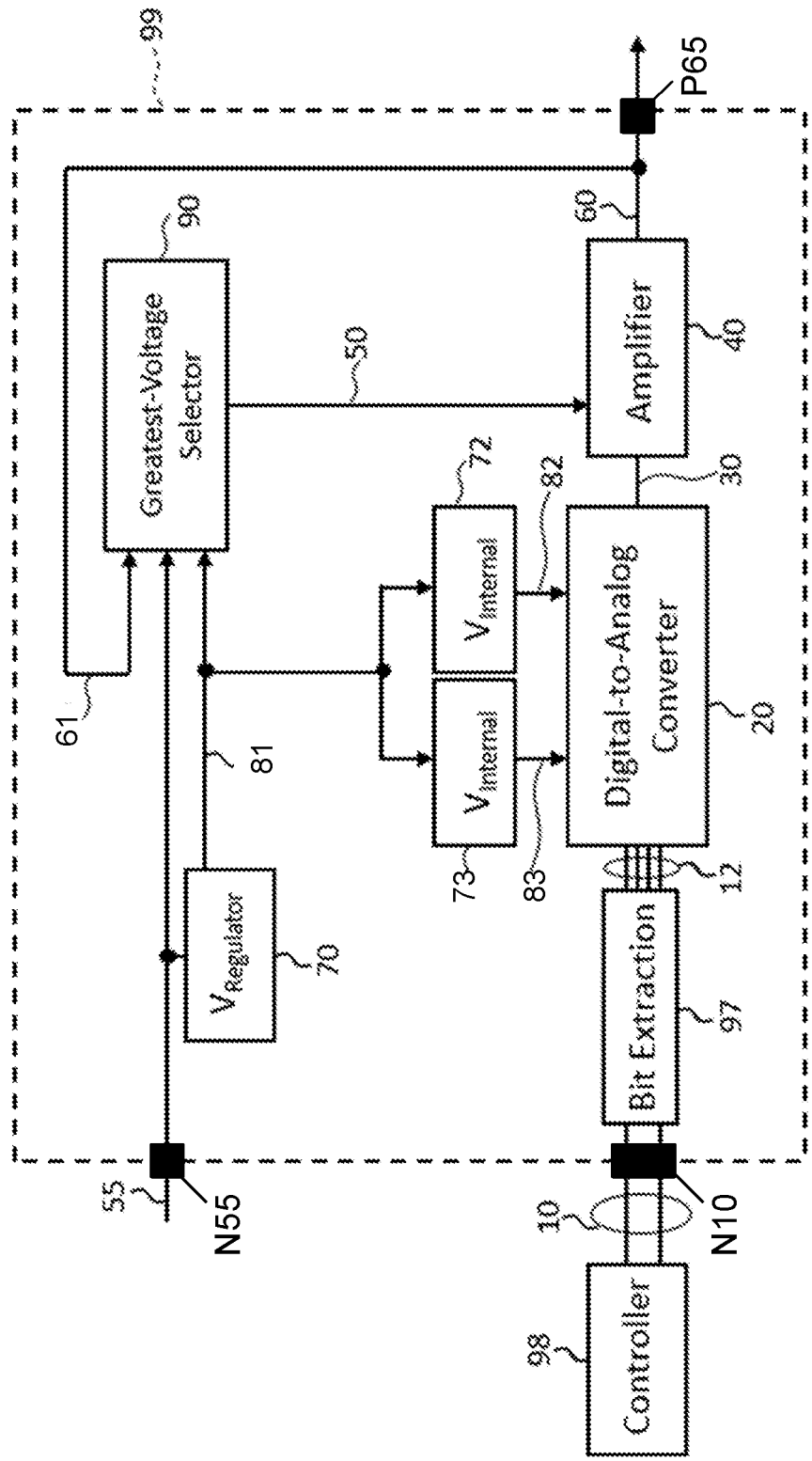
FIG. 2 is an exemplary block diagram of a portion of the circuit shown in FIG. 1, as can be used in embodiments of the present invention.
Figure 14:
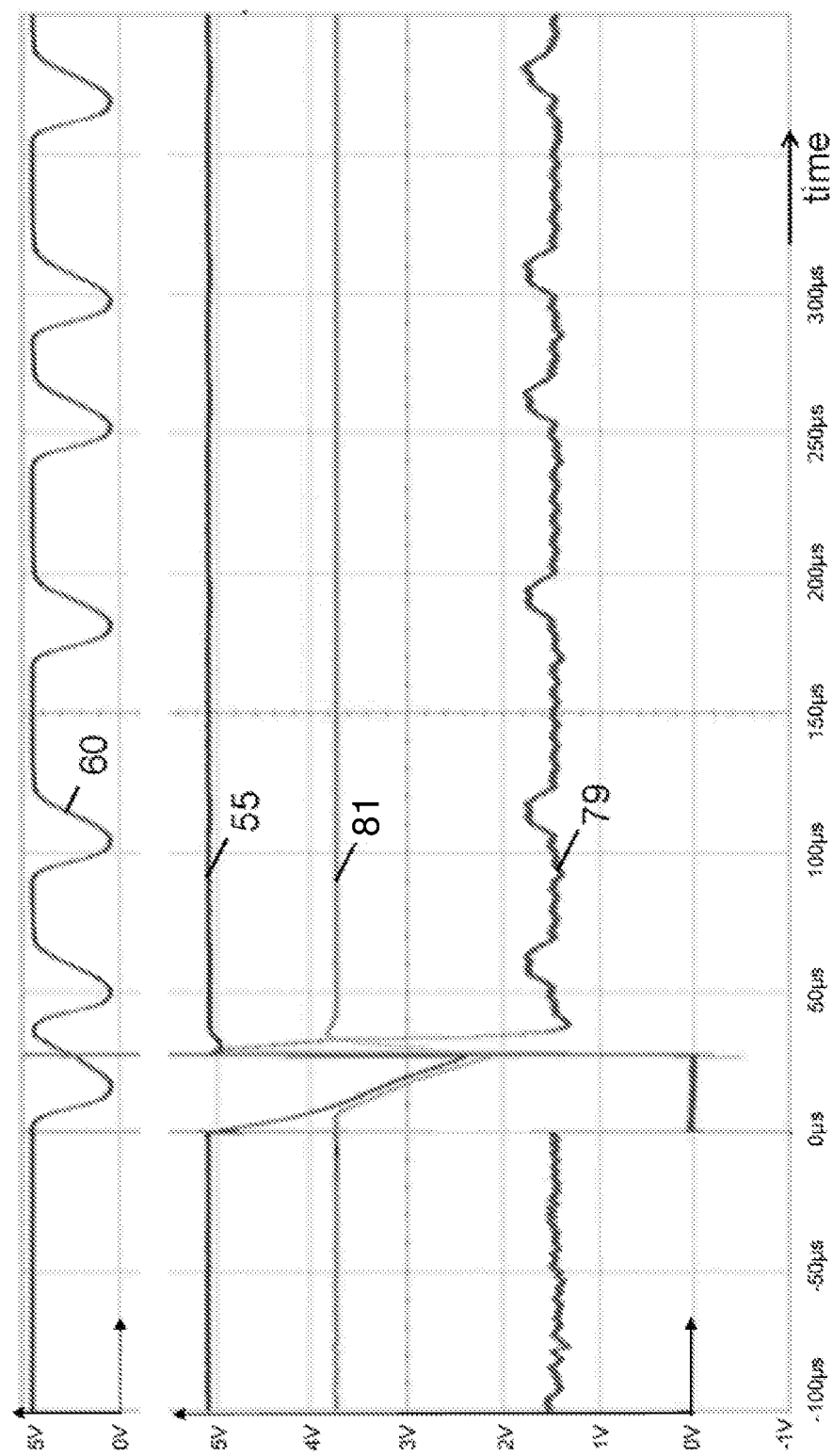
FIG. 14 shows a set of exemplary waveforms illustrating certain aspects of the present invention.

FIG. 2 shows a block-diagram of an exemplary output-stage circuit 99 that is less sensitive or substantially insensitive to supply-voltage variability and micro-interruptions as may occur for example in an automotive environment, as can be used in the integrated circuit of FIG. 1. For readers unfamiliar with the word "micro-interruption", reference is made to FIG. 14 showing an example of a 5 Volt supply signal with a "micro-cut" or "micro-interruption" having a duration of about 25 microseconds. In the example shown in FIG. 14, the voltage of the supply line temporarily drops from 5V to about 2.5 Volts, and then restores back to 5V.

Referring back to FIG. 2, the output stage circuit 99 is configured for receiving a digital input signal 10 which varies over time to specify an analog information signal (output signal 60) whose value is determined by successive voltage state changes of the analog information signal from a voltage greater than or equal to a high state voltage to a voltage less than or equal to a low state voltage. Or stated in simple terms, the DAC 20 is typically provided with a digital bitstream to generate the smooth signal shape shown for example in FIG. 10(B), for low EMC emission.

Referring back to FIG. 2, the DAC 20 is responsive to the bits 12 in a digital input signal 10 to produce an analog converted signal 30. The digital input signal 10 can be encoded in a variety of ways, for example as a binary value, and the bits 12 can be encoded similarly or differently (for example in a unary code) corresponding to the type of DAC 20.

In an embodiment, the DAC 20 is configured for generating a converted signal 30 having a voltage in the range from 0 V to 2.5V, and the amplifier 40 is configured for amplifying by a factor of 2.0, such that the output signal 60 has an output range from 0V to about 5V.

In another embodiment, the DAC 20 is configured for generating a converted signal 30 having a voltage in the range from 0 V to 3.3V, and the amplifier 40 is configured for amplifying by a factor of about 1.50, such that the output signal 60 has an output range from 0V to about 5V.

The skilled person having the benefit of the present disclosure can easily find other suitable voltage ranges of the DAC 20 and a corresponding amplification factor of the amplifier 40 so as to obtain an output range from 0V to 5V. In preferred embodiments, the amplification factor of the amplifier is a value in the range from 1.1 to 4.0, or from 1.5 to 3.0, or from 1.5 to 2.0.

Figure 4:
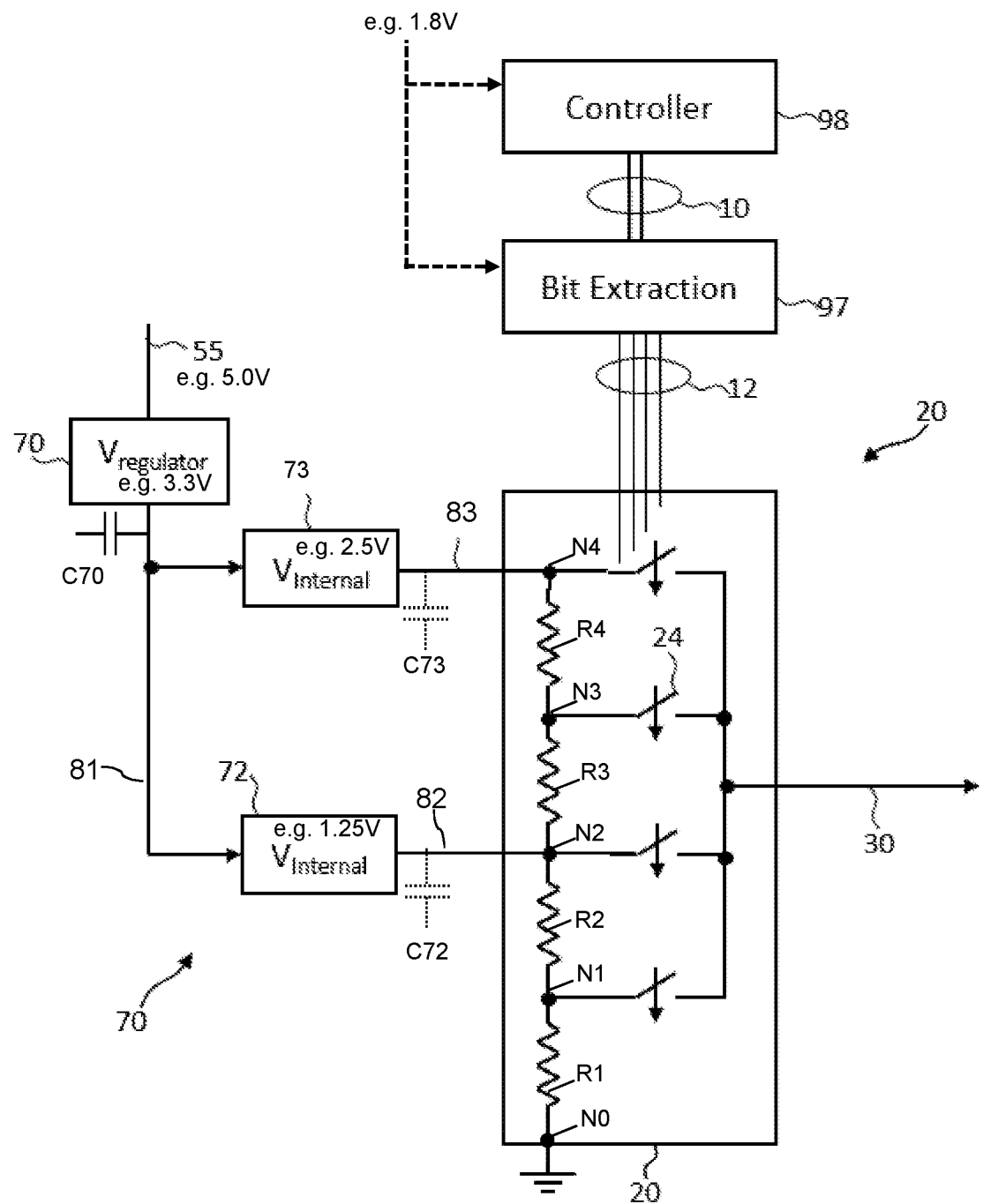
FIG. 4 to FIG. 7 are detailed schematics of portions of the circuit of FIG. 2, according to illustrative embodiments of the present invention.

In preferred embodiments, the DAC 20 comprises two or more series-connected resistors, defining three or more nodes N1, N2, N3, N4 (FIG. 4). Depending on the values of these resistors, the DAC (without the two voltage inputs) is known as a "unary coded DAC" or as a "binary weighted DAC". A bit-extraction circuit 97 can make any conversion necessary between the controller 98 and the DAC 20. But the present invention is not limited thereto, and DACs having other resistor values may also be used, as long as a corresponding bit extraction block 97 provides a suitable bitstream to generate the desired (e.g. predefined) waveform.

The exemplary output stage circuit 99 of FIG. 2 contains a first voltage regulator 70, and a second voltage regulator 72, but also a third voltage regulator 73. It is noted that a third voltage regulator is not absolutely required (see FIG. 5), and can be omitted, in which case the output 81 of the first voltage regulator 70 would be provided to the DAC.

In preferred embodiments, the greatest voltage selector circuit 90 not only selects the maximum of two voltage signals 55 and 81, but can also select a signal obtained from the output of the amplifier 60 (referred to herein as "feedback signal" or "return signal"), if this voltage is higher. The latter is clearly inventive, since it is not trivial to use the output of an amplifier to power itself. In order to better explain how this can work, reference is made to FIG. 3.

Figure 3:
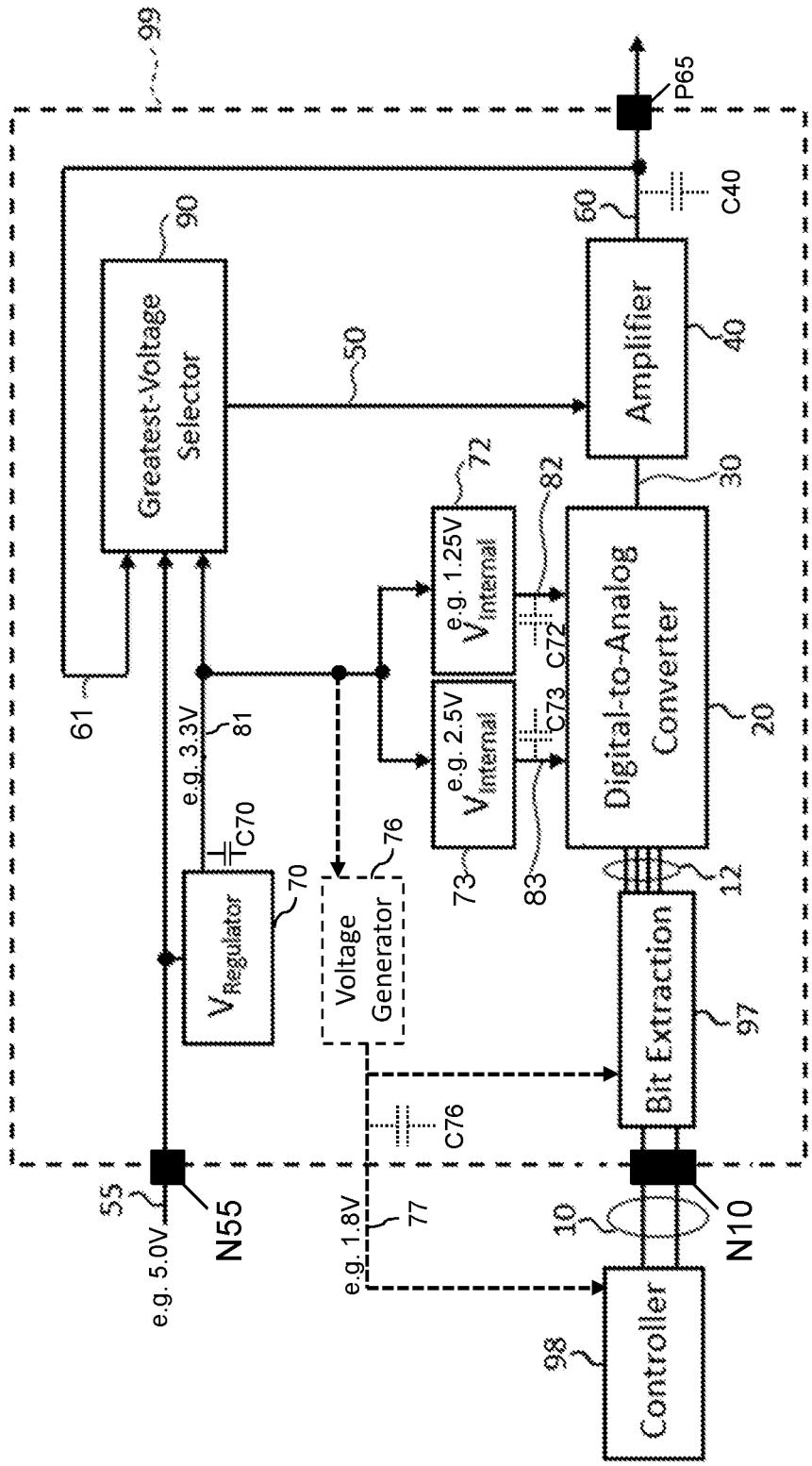
FIG. 3 shows a more detailed example of the block diagram of FIG. 2.

FIG. 3 shows a specific example of the block diagram of FIG. 2, with exemplary values, but of course the present invention is not limited to these values. Internal voltage supplies (e.g., second internal voltage supply 72 and third internal voltage supply 73) are each responsive to a first internal voltage signal 81 and each supply a respective voltage signal at a different voltage (e.g., second voltage signal 82 of about 1.25 V, and third voltage signal 83 of about 2.5 V respectively). These voltage signals are applied to respective nodes of the DAC, e.g. to node N2 and N4 (see FIG. 4).

The amplifier 40 receives an amplifier supply voltage signal 50 and is responsive to the converted signal 30 (from the DAC) to amplify the analog converted signal 30 and produce an analog output signal 60.

A greatest-voltage selector circuit 90 selects the greatest voltage from among any combination of various signals in the output-stage circuit 99, for example from a supply voltage signal 55 (typ. about 5V), the first internal voltage signal 81 (typ. about 3.3V), and a "return signal" originating from the output node of the amplifier 40.

The reader may wonder how the latter signal can possibly help in the event of a power-dip, but the inventors discovered that, during normal use, the output port P65 is connected to a wire which has a certain capacitance (Cload, see FIG. 7), which capacitance happens to be "fully loaded" (close to 5V) at the start of the falling edge generation. The "return signal" 61 allows to provide some of the energy stored on this capacitance to (temporarily) power the amplifier.

In some embodiments, the output stage circuit 99 may further comprise a capacitor C40 having a value of at least 1 nF. A typical value of C40 would be in the range from 1 to 100 nF, or from 2 nF to 50 nF, or from 5 nF to 20 nF, e.g. equal to about 10 nF. (it is noted that a parasitic capacitance is much smaller than 1 nF). The capacitor C40 may be integrated in the semiconductor substrate, or may be a discrete, e.g. a ceramic capacitor embedded in the chip package. However, because a wire will be connected to the amplifier output node, the capacitor C40 is optional (as indicated by the dotted capacitor symbol).

For completeness, it is noted that the second voltage regulator 72 may also comprise a fully integrated capacitor C72 (implemented in the semiconductor substrate) having a capacitance in the range from about 10 pF to about 1 nF, but this capacitor C72 is completely optional, and the invention will also work without this capacitance. The same is true for the (optional) third voltage regulator 73, which may have an optional fully integrated capacitor C73. If present, their main purpose is to help regulator amplifier stability.

In contrast, the first voltage regulator 70 does have a capacitor C70, preferably in the form of a discrete capacitor C70, not embedded in the semiconductor substrate, but preferably incorporated in the packaged device. In operation, the first internal regulated voltage supply 70 receives the supply voltage signal 55 (e.g. about 5.0 V nominal) and produces a first regulated internal voltage signal 81 (e.g. about 3.3 V nominal). During normal operation, the first internal regulated voltage supply 70 charges the capacitor C70, so that in the event of supply voltage signal 55 micro-interruption or variation, the first internal regulated voltage supply 70 can continue to provide power via the first internal voltage signal 81 for a relatively short period of time, and at a gradually decreasing voltage level. The value of the capacitor C70 is preferably a value in the range from 100 nF to 200 nF, so as to sustain an operating voltage of the entire chip to be above 2.2V for a couple of microseconds. This function keeps the digital alive to avoid reset generation. The first internal voltage signal 81 produced by the first internal regulated voltage supply 70 may have reduced voltage variability (also known as "voltage ripple") compared to the supply voltage signal 55. Suitable voltage regulators are known in the electronic arts.

The first internal voltage signal 81 is received by the second internal voltage regulator 72 and if present, also the third voltage regulator 73, and each of the second and third voltage regulator produces a different voltage (e.g. 1.25V and 2.5V in FIG. 3). Preferably the second voltage regulator 72, and if present also the third voltage regulator 73 are linear voltage regulators, e.g. low-dropout or LDO regulators.

FIG. 3 shows that the integrated semiconductor device may comprise further voltage generators, for example voltage generator 76 configured for generating a nominal voltage of about 1.8V, to be supplied to digital parts of the circuit. While illustrated within the block diagram of the output stage circuit 99, this further voltage regulator 76 does not really play a role in the output stage circuit, as long as the digital circuitry, including the controller 98 and the bit extraction circuit 97, does not reset in case of a "power-dip", which in practice is not problematic, considering that the voltage of 1.8V is substantially lower than the first voltage signal 81 (e.g. about 3.3V).

FIG. 4 shows in more detail an example of the digital-to-analog converter 20, and its interfaces. As shown, the DAC 20 comprises two or more series-connected resistors, in the example four resistors R1, R2, R3, R4 connected in series. The ends of the series connected resistors define a plurality of nodes N0 . . . N4. The resistors R1 and R2 define a lower segment of the DAC. The resistors R3 and R4 define a upper segment of the DAC.

As can be seen, the upper segment R3, R4 is connected at its upper end (at node N4) to the output of the third voltage regulator 73 and is connected at its lower end (at node N2) to the output of the second voltage regulator 72. In the example, node N4 is supplied with nominal voltage 2.5V and node N2 is supplied with nominal voltage 1.25V.

The lower segment is connected at its lower end (at node N0) to ground, and at its higher end (at node N2) to an output of the second voltage regulator 72. In the example, node N2 is supplied with nominal voltage 1.25V and node N0 is connected to ground.

As can be appreciated, in case of a power-dip, when the voltage generated by the first voltage regulator 70 can no longer be maintained at 3.3V, and more specifically drops to a level below 2.5V, the output of the third voltage regulator 73 will also drop below its nominal value (thus below 2.5V), hence the signal generated by the DAC will be distorted (see e.g. the upper part of the waveform of FIG. 11e). But, as long as the output level of the first voltage signal 81 is higher than about 2.0V, the second voltage generator 72 will be able to generate signal 82 of about 1.25V, which (in this example) is supplied to the node N2, which will prevent, or at least drastically lower the risk, that the converted signal 30 (at the output of the DAC) drops below about 0.9V-1.0V, and thus the amplified signal 60 would drop below the predefined threshold voltage of about 1.8V to about 2.0V.

In some embodiments of the present invention, the DAC 20 is of the type known as "unary coded DAC" or "thermometer-coded DAC". Such a DAC comprise an equal resistor for each possible value of DAC output (e.g., each possible value of converted signal 30). Thus, a four-bit DAC 20 with 16 possible input values would have 16 resistors of equal resistance, and the upper node will have a voltage of 2.5V, the next lower node will have a voltage of 2.5V*(15/16), the next lower node will have a voltage of 2.5V*(14/16), etc. Importantly, however, thanks to the principles of the present invention, the intermediate, e.g. central node, will have a voltage of 1.25V, even if the voltage applied to the upper node will be lower than 2.5V, e.g. will only be about 2.0V. This prevents the output of the DAC to change proportional to the voltage level applied at the top of the resistor-chain, as would be the case with a classical DAC. The net effect is that a portion of the signal will be distorted (see FIG. 11e), but the signal will not pass the threshold level of the receiver, because another node of the DAC, e.g. a central node of the DAC is supplied with a second voltage level, which, after multiplication with the amplifier, is higher than the threshold level of the receiver.

If all resistors have the same value, the series connection of the resistors will equally divide the voltage applied to the upper node. At each moment in time, only one of the nodes will be connected to the output of the DAC, by a bit switch 24, suitably controlled, for example each bit switch being responsive to a different one of the bits 12 of the digital input signal 10 to produce the converted signal 30.

FIG. 2 to FIG. 5 illustrate how two-bit binary values received from the controller 98 (for example a sensor control circuit) are converted by the bit extraction circuit 97 (e.g., such as a demultiplexer) to provide an active signal on only one of four control wires, each of which controls a single bit switch 24, to connect one of the nodes corresponding to the two-bit value to the DAC output, thereby providing a converted signal 30 having a voltage corresponding to the two-bit value. But of course, the present invention is not limited to digital values having only two-bits, and DACs having only four possible output levels.

In another embodiment of the present invention (not shown), the DAC 20 is a binary-weighted DAC 20 and the resistors do not have equal resistance values, but resistors corresponding to the weighting. For example, each resistor may have a resistance value which is a factor of two higher than the adjacent lower resistor. In this case, the voltage outputs from each binary-weighted resistor is summed to provide a correct analog converted signal 30 (not shown in the Figures). This reduces the number of resistors but requires very accurate resistor values to provide an accurate analog converted signal 30.

In summary, by applying a DAC comprising a plurality of series connected resistors and a plurality of switches, and by applying two different voltages to that resistor-chain, a (relatively) high voltage at the top, and an intermediate voltage substantially halfway the chain, a DAC output is created that is accurate in the lower output range. By choosing the second voltage level slightly larger than the so called "slicing level" or "threshold level" of the receiver, (e.g. about 0.1V to 0.5V higher) a timing error is avoided (at the nibble-level), and a CRC error is avoided at frame or package level, even if the signal is distorted above the slicing level.

FIG. 5 shows a variant of the circuit shown in FIG. 4. In this embodiment, the semiconductor device also has the first and the second voltage regulator 70, 72, but the third voltage regulator 73 is omitted. In this embodiment, the first voltage signal 81 (e.g. 3.3V in the example) is provided as one voltage (the "high voltage") to the DAC, and the second voltage signal 82 (in this case e.g. about 1.65V) is provided as another voltage (the "medium voltage") to the DAC. The principles of operation are largely the same as described above. Indeed, as long as the first voltage signal 81 is at the first nominal voltage level (in the example 3.3V), all series resistors of the DAC will correctly divide the voltage applied to the upper node (here: node N4) by four. In case of a power-dip, the voltage level of the signal 81 will decrease below 3.3V, but as long as signal 81 is larger than 1.65V, the two voltage signals provided to the DAC are also larger than 1.65V. And while the signals obtained from the upper nodes N3 to N4 may be distorted (hence the initial portion of the "falling edge" may be distorted), it will be at least 1.65V. But, importantly, the second portion of the "falling edge", obtained from the nodes N0 to N2 will be undistorted, because these voltages are determined by the value of the signal 81 applied to node N2, irrespective of the value of the signal 81 supplied to node N4.

Referring back to FIG. 2 or FIG. 3, the analog converted signal 30 is received by the amplifier 40. The amplifier 40 receives power from a greatest-voltage selector circuit 90. The greatest-voltage selector circuit 90 receives multiple voltage signals and selects the voltage signal with the greatest voltage of those supplied and provides it to the amplifier 40 as the supply voltage signal 50. In some embodiments of the present invention, the amplifier supply voltage signal 50 may also be provided to other circuit elements.

In an embodiment, the multiple voltage signals provided to the greatest-voltage selector circuit 90 include the supply voltage signal 55 (e.g. nominal 5V), and the first regulated internal voltage signal 81 (e.g. nominal 3.3V).

In another embodiment, the multiple voltage signals provided to the greatest-voltage selector circuit 90 include the supply voltage signal 55 (e.g. nominal 5V), and the first regulated internal voltage signal 81 (e.g. nominal 3.3V), and a return voltage signal 61 obtained from the output of the amplifier 40, or actually, from the node P65 connected to the output of the amplifier 40. While not absolutely required for the present invention to work, this node P65 may be connected to a discrete capacitor, e.g. a second discrete capacitor which is incorporated in the chip package but not fully integrated in the semiconductor substrate, or to a fully integrated capacitor C40, but again, this capacitor C40 is optional, and can be omitted. In addition, as shown in FIG.

Figure 7:
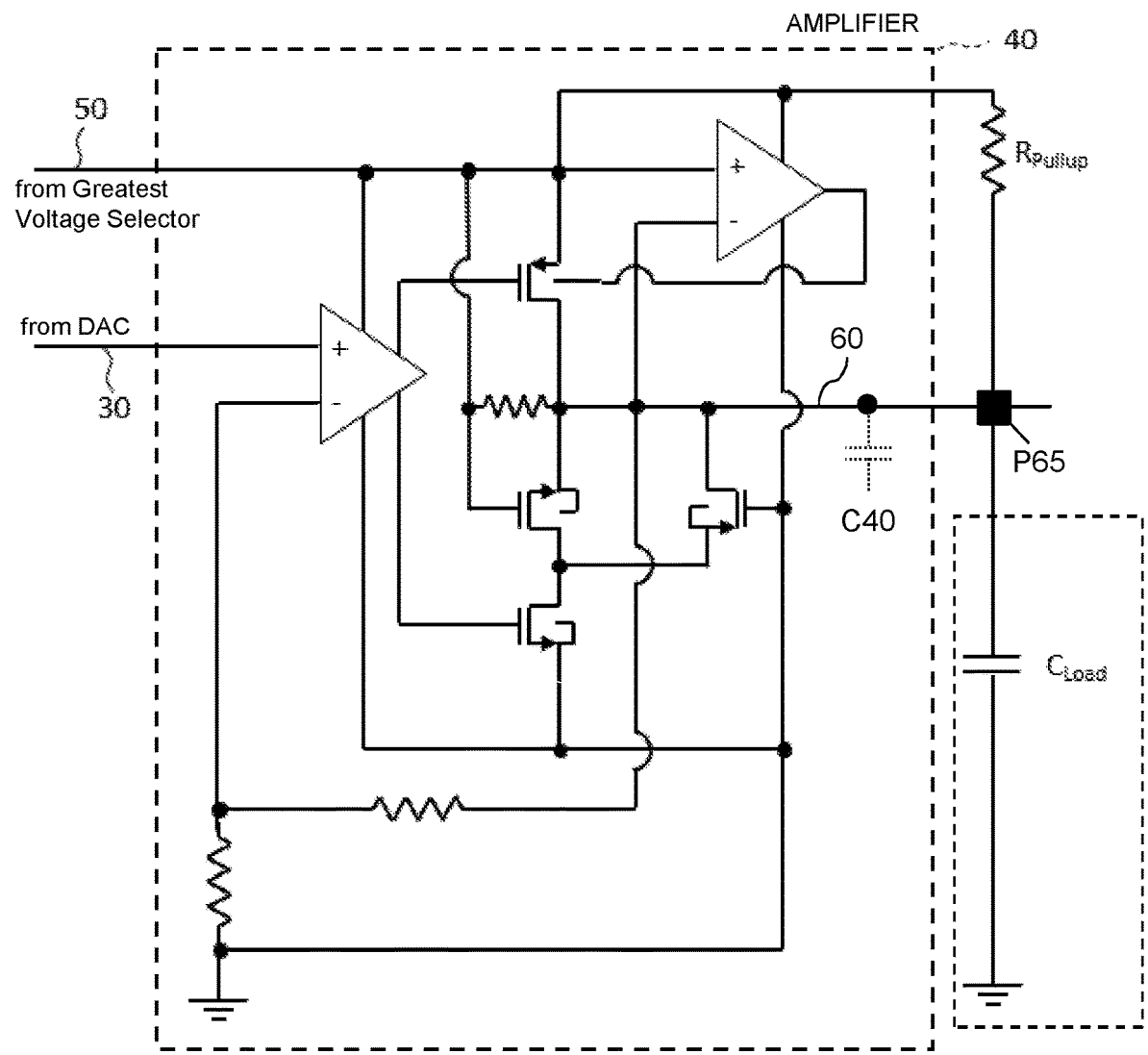

1 and FIG. 7, at system level, the node P65 is also connected to an external wire having a load capacitance Cload. As described above, energy stored on this or these capacitors C40, Cload are especially useful when a power-interruption substantially coincides with a falling edge of the output signal 60, because shortly before the falling edge, the amplifier output signal 60 was high (e.g. about 5V), thus the capacitor(s) C40 and Cload are fully charged at the start of the falling edge. In the event of a micro interruption of the supply voltage signal 55, each of the supply voltage signal 55, or the first regulated internal voltage signal 81, or the return signal 61 may temporarily have the largest voltage level, and may be selected and provided as the amplifier supply voltage signal 50. As mentioned above, this works for the falling edge, because the capacitor(s) C40 and Cload are discharging during the falling edge but would not work for a rising edge.

Figure 6:
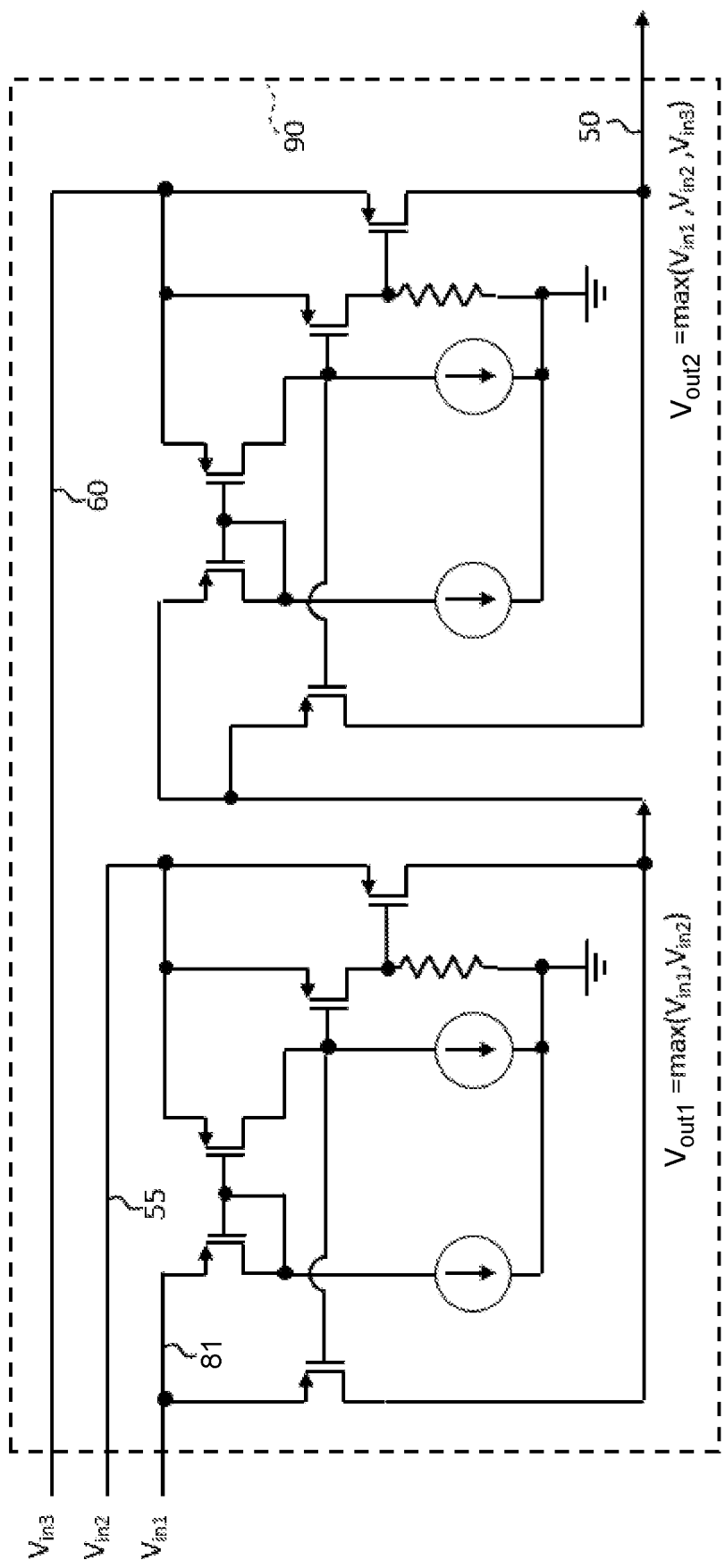

FIG. 6 shows an example of an exemplary greatest-voltage selector circuit 90 as can be used in embodiments of the present invention, but the present invention is not limited hereto, and other circuits may also be used. The circuit of FIG. 6 comprises two cascaded circuits. The first circuit select the highest signal out of Vin1, Vin2 and provides Vout1. The second circuit selects the highest signal out of Vout1 and Vin3, thus overall, selects the highest signal out of Vin1, Vin2, Vin3. As indicated by the labels, Vin2 may correspond to the supply voltage signal 55 (e.g. nominal 5V), Vin1 may correspond to the first internal voltage signal 81 (e.g. nominal 3.3V), and signal Vin3 may correspond to the return signal 61 (varying between 0V and 5V, but at the start of a falling edge of the output signal, having a value of 5V). This is another reason why it is not obvious to use the return signal 61 as a possible input for the greatest voltage selector: its voltage level is not constant.

FIG. 7 shows an example of an exemplary amplifier circuit 40 as can be used in embodiments of the present invention, but the present invention is not limited hereto, and other amplifier circuits may also be used. As shown, and as discussed above, the amplifier circuit 40 may have a small capacitor C40. If present, the value of C40 is typically chosen sufficiently small to not significantly interfere with the signal generation, and sufficiently large to improve other EMI signals to be tested, such as for example direct power injection Tests and powered ESD tests. This capacitor typically has a value in the order of a couple of nF, for example in the range from 1 to 10 nF.

As described above, the node P65 is typically connected to a wire from a bus. The bus may be a multi-wire bus, e.g. in the case of SENT, a three-wire bus, containing a data-line, a ground line and a supply voltage line. Such a data-wire also has a capacitance Cload from which power can be drawn temporarily during a power cut.

The amplifier circuit 40 is preferably configured to multiply its input, namely the signal 30 obtained from the DAC, by a predefined factor, such that the amplified signal 60 varies in a predefined range, for example in case the signal is a SENT signal, in the range from 0V to 5V. For example, if the DAC provides a "converted signal 30" in the range from 0V to 2.5V (see e.g. FIG. 3), the amplifier is configured to multiply by a predefined factor equal to about 2.0. Or if the DAC provides a "converted signal 30" in the range from 0V to 3.3V (see e.g. FIG. 4), the amplifier is configured to multiply by a factor of about 1.5.

The amplifier 40 can be a simple amplifier, for example an operational amplifier connected as a closed-loop voltage amplifier. In other embodiments, e.g. as shown in FIG. 7, a more-complex circuit can also protect against negative voltages at the output node P65 and protect against reverse currents into the supply input P55 when the voltage at the output node P65 rises above the supply voltage level.

For completeness, it is mentioned that the pull-up resistor is not absolutely required for the invention to work and may be omitted. Such a pull up resistance is specified in the SENT specification. Its goal is to have the output level drift to the supply voltage in case of a "loss of ground wire" or the amplifier being in tri-state.

Figure 8:
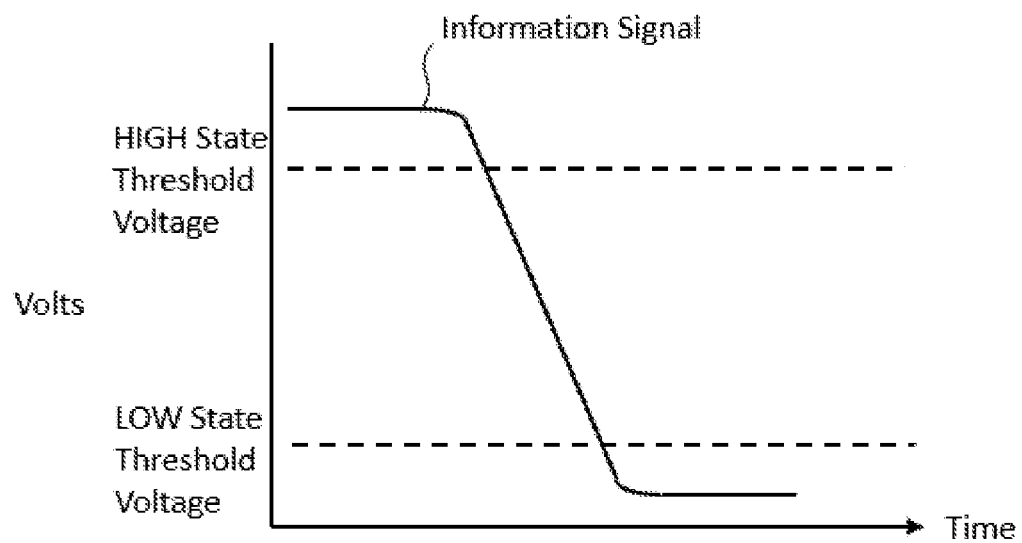
FIG. 8 is a graph illustrating voltage state changes according to illustrative embodiments of the present invention.

FIG. 8 shows a portion of a waveform which varies from a logic high signal to a logic low signal, thus showing a "falling edge". An information signal is at a HIGH voltage, for example at 5.0 Volts. To indicate the beginning of a data transmission, the information signal voltage changes from a voltage (e.g. 4.5 volts) greater than or equal to the HIGH state voltage (e.g., 3.8 volts) to a voltage (e.g. 1.0 volts) less than or equal to a LOW voltage (e.g. 1.39 volts), to indicate the beginning of the interval defining the data value.

Figure 9:
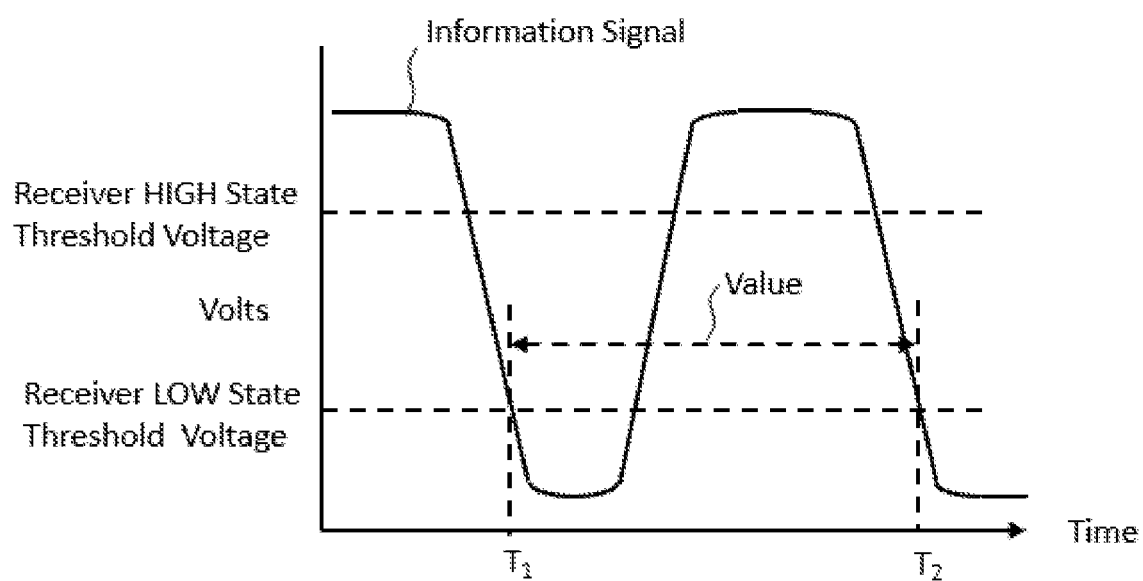
FIG. 9 is a graph illustrating a data value derived from a voltage state change interval between a negative-going state change from a high state voltage to a low state voltage of an information signal, for a stable supply voltage, according to illustrative embodiments of the present invention.

FIG. 9 illustrates that, in the SENT protocol, the time interval between successive falling edges is used to represent data values. Of course, the SENT-protocol involves more than only the time interval between falling edges, (which format is taken care of by the processor), but the drawing illustrates that, if for example, the first falling edge would become too steep in the event of a power loss, the time T1 at which the falling edge passes the receiver low state threshold voltage would be wrong, and thus the time duration between T2 and T1 would be wrong, resulting in an incorrect interpretation of the data, ultimately resulting in a CRC error.

Figure 10A:
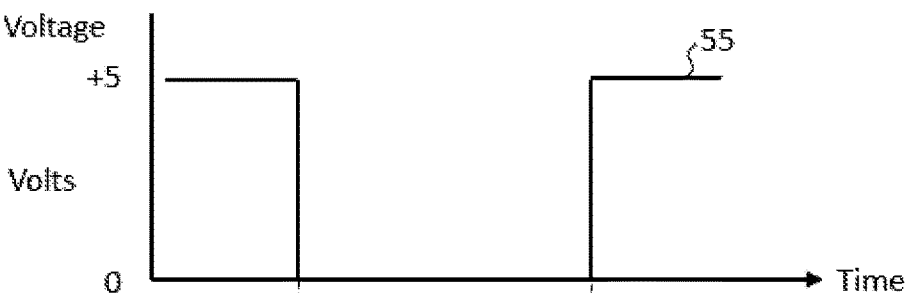
FIGS. 10A to 10C show exemplary graphs illustrating the performance of a circuit without the benefit of the present invention, in the presence of a supply voltage interruption.
Figure 10B:
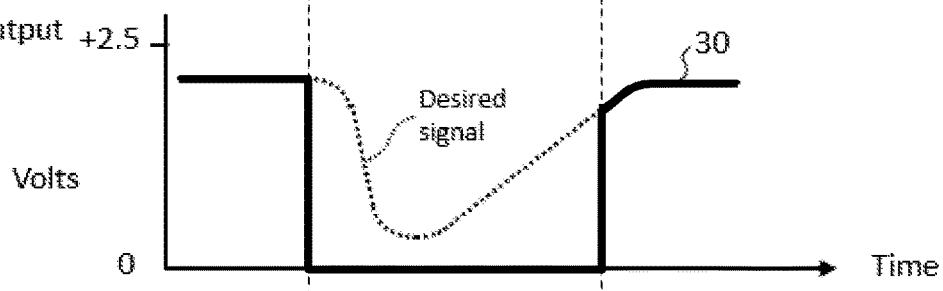
Figure 10C:
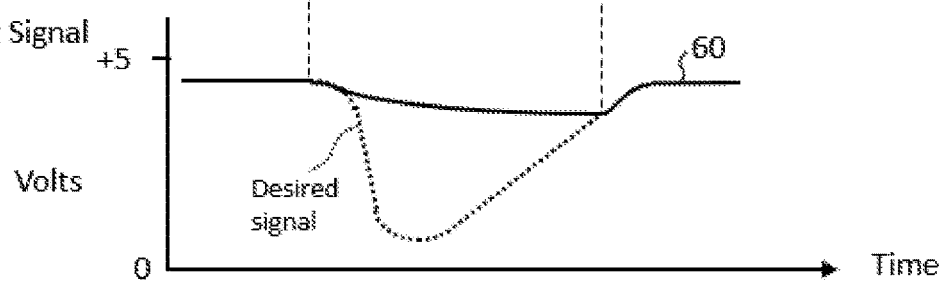

FIGS. 10A to 10C illustrate by way of an example, the typical performance or behavior of a classical circuit having a block diagram such as the one shown in FIG. 1, but without the benefit of the present invention, during a voltage state change from HIGH to LOW and then again to HIGH, as might be found defining the beginning of a nibble of a SENT signal in the presence of a supply voltage signal micro-interruption. In the example shown in FIG. 10A, the supply voltage signal 55 suffers a micro-interruption and temporarily drops from 5.0 volts to zero, for example for a duration of about 20 to 30 microseconds, for example about 25 µs. This will typically have the effect of setting the output of the DAC to zero, as shown in FIG. 10B) until the supply voltage signal 55 recovers. The waveform indicated by "desired signal" indicates a voltage state change from HIGH to LOW and then again to HIGH, to signal the beginning of a nibble. The amplifier 40 can have some capacitance C40, or is typically connected to some capacitance Cload, as discussed above, so that the output signal 60 does not immediately drop to zero, but rather discharges over time until the supply voltage signal 55 recovers, as shown in FIG. 10C). In the absence of a greatest voltage selector circuit and power storage in the amplifier 40, the output signal 60 would immediately drop to zero when the supply voltage signal 55 is interrupted (not shown in the Figures). If an internal regulated voltage supply (e.g. first internal regulated voltage supply 70) is provided, and the amplifier would be supplied by the larger of the supply voltage (nominal 5V) and the first voltage signal 81 (nominal 3.3V), the decrease of the output signal 60 may be delayed or its impact would be less severe, but a decrease of the output level cannot be avoided, and will likely cause a timing error, resulting in a CRC error at the receiver.

As shown in FIGS. 11A to 11E, with the benefit of embodiments of the present invention, the amplifier output signal 60 can be provided much more accurately in the presence of supply voltage signal 55 micro-interruptions. As shown in FIG. 11A, the supply voltage signal 55 suffers a micro-interruption and temporarily drops to zero (similar as in FIG. 10A). This will cause a gradual decrease of the voltage level of the first voltage signal 81 (sketched in FIG. 11B) and depending on the length of the supply-interruption, also a decrease of the voltage level of the third voltage signal 83 (see FIG. 3 to FIG. 5).

As described above, the solution proposed by the present invention addresses especially the situation where the voltage level of the first voltage signal 81 is decreasing below its nominal value (e.g. below 3.3V) to such a degree that—without the solution of the present invention—the DAC output signal 30 would drop to a voltage below the receiver threshold voltage, causing a falling edge detection at the wrong moment by the receiver.

However, as described above (see FIG. 2 to FIG. 5), thanks to the first, second and optionally third internal voltage regulators 70, 72, 73 and the "special DAC" having two voltage inputs, and the "greatest voltage selector circuit", the lower portion of the "falling edge waveform" can still be correctly generated, despite the power loss. As illustrated in FIG. 11C, even though a first portion of the falling edge may decrease faster than intended, the signal is prevented from decreasing below the threshold level of the receiver. As illustrated in FIG. 11(e) the net effect being that for the envisioned power cuts, the output stage circuit 99 of the present invention is capable of shifting the time at which the output signal passes the threshold voltage from time Tx to time Ty, thus avoiding a data error.

It is noted that, in practice, the receiver slicing level (or threshold level) is typically around 2.2V with a 10% to 20% hysteresis, thus from about 2.0V to about 2.4V.

Figure 12:
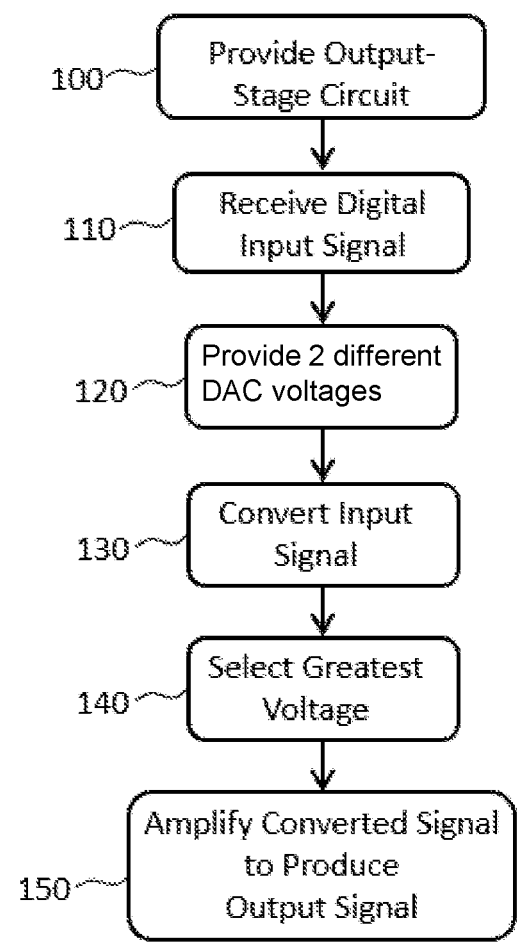
FIG. 12 shows a high-level flowchart of a method according to an embodiment of the present invention.

Referring to FIG. 12, a method of operating the output-stage circuit 99 comprises:
providing 100 a supply-voltage-insensitive output-stage circuit 99;
receiving 110 a digital input signal;
providing 120 at least two different voltage signals to the DAC;
converting 130 the digital input signal 10 by means of a digital-to-analog converter (DAC) 20 to produce a converted signal 30;
selecting 140 a greatest voltage using a greatest-voltage selector circuit 90 and providing the selected voltage as a supply voltage signal 50 to the amplifier 40; and
amplifying 150 the converted signal 30 using the amplifier 40 to produce the output signal 60, to be transmitted.

Figure 13:
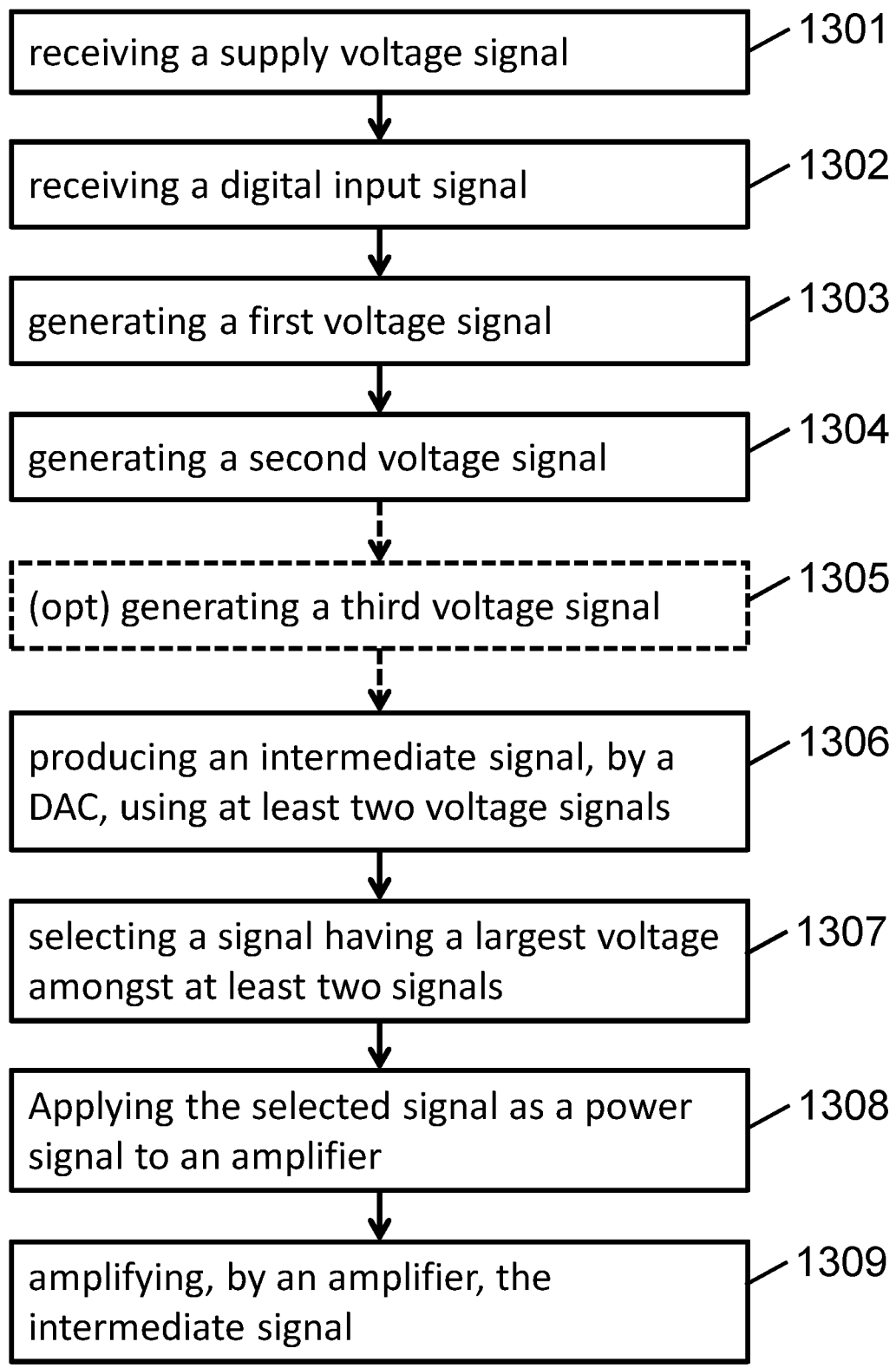
FIG. 13 shows a more detailed flowchart of a method according to an embodiment of the present invention.

FIG. 13 shows a flow-chart of a method 1300 of converting a digital input signal 10 into an analog output signal 60 in an output stage circuit 99 of an integrated circuit, the method comprising:
receiving 1301 a supply voltage signal 55 from a supply voltage node N55, the supply voltage having a nominal supply voltage level (e.g. about 5.0 V);
receiving 1302 said digital input signal 10 from a digital input node N10;
generating 1303 by a first voltage regulator 70 a first voltage signal 81 derived from the supply voltage signal 55, and storing energy on a first capacitance C70, the first voltage signal having a nominal first voltage level (e.g. about 3.3V) lower than the nominal supply voltage level (e.g. about 5V);
generating 1304 by a second voltage regulator 72 a second voltage signal 82, derived from the first voltage signal 81 or from the supply voltage signal 55, the second voltage signal 82 having a nominal second voltage level (e.g. about 1.25V or 1.65V) lower than the nominal first voltage level (e.g. about 3.3V);
optionally generating a third voltage signal 83 by a third voltage regulator 73, the third voltage signal 83 having a nominal third voltage level (e.g. about 2.5V) between the nominal first voltage level and the nominal second voltage level;
producing 1306 a converted (or intermediate) signal 30 derived from said digital input signal 10, by a digital-to-analog convertor 20 based on at least two voltage signals derived from the supply voltage signal 55;
selecting 1307, by a largest voltage selector circuit, a signal having a largest voltage level amongst a plurality of at least two signals including the supply voltage signal 55 and the first voltage signal 81, and applying 1308 the selected signal as a power signal 50 to the amplifier 40;
amplifying 1309 the converted (or intermediate) signal 60, by an amplifier 40, thereby generating the output signal 60.

FIG. 14 shows a set of exemplary waveforms illustrating certain aspects of the present invention.

In the upper graph, an exemplary output waveform 60 is displayed. In this example, the falling edge of the waveform is correctly generated, despite a power-interruption (from t=0 μs to t=25 μs).

In the lower graph, three exemplary signals are shown: a supply voltage 55 having a nominal value of 5V but dropping to about 2.5V because of a power-interruption (from t=0 μs to t=25 μs). Also shown is a first regulated voltage signal 81 having a nominal value of about 3.7V, dropping to about 2.2V during the power-interruption. The graph also shows a supply current 79 (although not relevant for the present invention).

While the invention was explained and illustrated for a communication according to the SENT protocol, the invention is not limited thereto, and can also be used for other serial communications, such as e.g. PWM or I2C or SPC, but of course the voltage levels may be different in this case.

While the invention was illustrated for a supply voltage having a nominal value of 5.0V, the invention is not limited thereto, and also works for other supply voltages and signal levels, e.g. a supply voltage and signal level of about 9V, which can be used in a 9V-variant of SENT. In such embodiment, the topology of FIG. 2 to FIG. 5 would still work, but the amplification factor would be chosen such that the amplifier output signal range would be from 0V to 9V in this case. For example, in case the second voltage signal 82 would be nominally 1.25V, and the third voltage supply signal 83 would be nominally 2.5V, thus the output range of the DAC would be from 0V to 2.5V, the amplification factor of the amplifier would be chosen equal to approximately 3.6.

Having described certain embodiments, it will now become apparent to one of skill in the art that other embodiments incorporating the concepts of the disclosure may be used. Therefore, the invention should not be limited to the described embodiments, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

The invention claimed is:

1. An integrated circuit comprising:
an output stage circuit for converting a digital input signal into an analog output signal, the output stage circuit comprising:
a digital input node for receiving the digital input signal;
a supply voltage node for receiving a supply voltage signal having a nominal supply voltage level;
a digital to analog convertor responsive to the digital input signal and adapted to produce a converted signal;
an amplifier configured for receiving and amplifying the converted signal, thereby generating the analog output signal;
wherein the integrated circuit further comprises a first voltage regulator adapted for generating a first voltage signal having a nominal first voltage level lower than the nominal supply voltage level, and for storing energy on a first capacitor at the nominal first voltage level; and
the integrated circuit further comprises a second voltage regulator, adapted for generating a second voltage signal having a nominal second voltage level lower than the nominal first voltage level; and
the digital to analog convertor is configured for producing the converted signal based on a plurality of at least two voltage signals derived from the supply voltage, including at least the second voltage signal; and
the output stage circuit further comprises a greatest-voltage selector circuit adapted for selecting a signal having a largest voltage level amongst a plurality of at least two signals including the supply voltage signal and the first voltage signal, and for providing the selected signal as a power signal to the amplifier.

2. The integrated circuit of claim 1, wherein the integrated circuit further comprises a third voltage regulator, configured for receiving the first voltage signal or the supply voltage signal, and adapted for generating a third voltage signal having a nominal third voltage level between the nominal first voltage level and the nominal second voltage level.

3. The integrated circuit of claim 1, wherein the greatest-voltage selector circuit is adapted for selecting a signal having a largest voltage level amongst a plurality of at least three signals including the supply voltage signal, the first voltage signal, and a voltage signal obtained from a node connected to an output of the amplifier.

4. The integrated circuit of claim 1, wherein the digital-to-analog converter comprises two or more series-connected resistors defining three or more nodes;
wherein one of said at least two voltage signals derived from the supply voltage is connected to one of said nodes, and another of said at least two voltage signals derived from the supply voltage is connected to another of said nodes.

5. The integrated circuit of claim 4, wherein the digital-to-analog converter is a unary coded DAC and each series-connected resistor has a substantially equal value.

6. The integrated circuit of claim 4, wherein the digital-to-analog converter is a binary-weighted DAC and each series-connected resistor has a value substantially one half or twice the value of a series-connected resistor to which it is directly connected.

7. The integrated circuit of claim 1, wherein the supply voltage signal is a voltage in the range from 4.5 to 5.5 Volt, or in the range from 4.75 to 5.25 Volt; and
wherein the integrated circuit further comprises a controller adapted for providing the digital input signal as a bitstream having a format such that the analog output signal derived therefrom is a single-edge nibble transmission protocol signal.

8. The integrated circuit of claim 7, further comprising a sensor circuit connected to said controller; and
wherein the controller is further adapted for obtaining a sensor signal from the sensor circuit, and for providing the digital signal as a function of the sensor signal.

9. The integrated circuit of claim 1, wherein the first voltage regulator is configured for generating the first voltage signal having the first nominal voltage in the range from about 3.0 to about 3.6 Volt; and
wherein the second voltage regulator is configured for generating the second voltage signal having the second nominal voltage in the range from about 1.10 to about 1.40 Volt; and optionally,
wherein the third voltage regulator, if present, is configured for generating the third voltage signal having the third nominal voltage in the range from about 2.2 to about 2.8 Volt.

10. The integrated circuit of claim 1, wherein the digital to analog convertor is configured for generating the converted signal having a voltage in the range from about 0.0 V to about 2.5V and wherein the amplifier is configured for amplifying the converted signal by a factor of about 2.0; or
wherein the digital to analog convertor is configured for generating an converted signal having a voltage in the range from about 0.0 V to about 3.3V and wherein the amplifier is configured for amplifying the converted signal by a factor of about 1.5.

11. A semiconductor device comprising:
an integrated circuit according to claim 1;
wherein said first capacitor is in the form of a discrete capacitor located outside but functionally connected to the integrated circuit.

12. A method of converting a digital input signal into an analog output signal in an output stage circuit of an integrated circuit, the method comprising:
receiving a supply voltage signal from a supply voltage node, the supply voltage having a nominal supply voltage level;
receiving said digital input signal from a digital input node;
generating by a first voltage regulator a first voltage signal derived from the supply voltage signal, and storing energy on a first capacitance, the first voltage signal having a nominal first voltage level lower than the nominal supply voltage level;
generating by a second voltage regulator a second voltage signal derived from the first voltage signal or from the supply voltage signal, the second voltage signal having a nominal second voltage level lower than the nominal first voltage level;
producing a converted signal derived from said digital input signal, by a digital-to-analog convertor based on at least two voltage signals derived from the supply voltage signal;
amplifying the converted signal, by an amplifier, thereby generating the output signal;

selecting, by a largest voltage selector circuit, a signal having a largest voltage level amongst a plurality of at least two signals including the supply voltage signal and the first voltage signal and applying the selected signal as a power signal to the amplifier.

13. The method of claim 12, wherein the digital-to-analog converter comprises two or more series-connected resistors defining three or more nodes; and wherein the method further comprises:

providing the second voltage signal to one of said nodes.

14. The method of claim 12, further comprising:

obtaining a return signal from an output node connected to the output of the amplifier; and wherein the step of selecting a largest voltage comprises:

selecting a signal having a largest voltage level amongst a plurality of at least three signals including the supply voltage signal and the first voltage signal and the return signal, and providing the selected signal as a power signal to the amplifier.

15. The method of claim 12, wherein the integrated circuit further comprises a sensor and a controller; and wherein the method further comprises the steps of:

obtaining sensor information from the sensor, by the controller; and providing the digital input signal as a bitstream containing the sensor information or data derived therefrom and having a format such that the analog output signal derived therefrom is a single-edge nibble transmission protocol signal.

\* \* \* \* \*